United States Patent
Liu et al.

(10) Patent No.: US 11,050,004 B2
(45) Date of Patent: Jun. 29, 2021

(54) MICRO PANCHROMATIC QLED ARRAY DEVICE BASED ON QUANTUM DOT TRANSFER PROCESS OF DEEP SILICON ETCHING TEMPLATES, AND PREPARATION METHOD THEREFOR

(71) Applicant: NANJING UNIVERSITY, Nanjing (CN)

(72) Inventors: Bin Liu, Nanjing (CN); Di Jiang, Nanjing (CN); Junchi Yu, Nanjing (CN); Xuan Wang, Nanjing (CN); Danfeng Pan, Nanjing (CN); Zili Xie, Nanjing (CN); Yugang Zhou, Nanjing (CN); Dunjun Chen, Nanjing (CN); Xiangqian Xiu, Nanjing (CN); Rong Zhang, Nanjing (CN)

(73) Assignee: NANJING UNIVERSITY, Nanjing (CN)

(*) Notice: Subject to any disclaimer, the term of this patent is extended or adjusted under 35 U.S.C. 154(b) by 0 days.

(21) Appl. No.: 17/044,057

(22) PCT Filed: Nov. 11, 2019

(86) PCT No.: PCT/CN2019/116991
§ 371 (c)(1),
(2) Date: Sep. 30, 2020

(87) PCT Pub. No.: WO2020/207009
PCT Pub. Date: Oct. 15, 2020

(65) Prior Publication Data
US 2021/0057614 A1    Feb. 25, 2021

(30) Foreign Application Priority Data
Apr. 9, 2019  (CN) .......................... 201910278874.6

(51) Int. Cl.
*H01L 33/50*   (2010.01)
*H01L 33/00*   (2010.01)
(Continued)

(52) U.S. Cl.
CPC .......... *H01L 33/502* (2013.01); *H01L 33/007* (2013.01); *H01L 33/0095* (2013.01); *H01L 33/32* (2013.01); *H01L 33/40* (2013.01)

(58) Field of Classification Search
CPC ..................................................... H01L 33/502
(Continued)

(56) References Cited

U.S. PATENT DOCUMENTS

2017/0373118 A1* 12/2017 Hugon ................... H01L 33/58

FOREIGN PATENT DOCUMENTS

| CN | 103400915 A | 11/2013 |
| CN | 103560186 A | 2/2014 |

(Continued)

OTHER PUBLICATIONS

Hua Yang et al, "Luminescence Property of GaN Nanorod", Chinese Journal of Luminescence, vol. 36 vol. 3, Mar. 15, 2015, p. 277-282.

*Primary Examiner* — Hsin Yi Hsieh
(74) *Attorney, Agent, or Firm* — Bayramoglu Law Offices LLC

(57) ABSTRACT

A micro panchromatic QLED array device based on a quantum dot transfer process of deep silicon etching templates. Array-type square table structures pass through a p-type GaN layer and a quantum well active layer and are deep to an n-type GaN layer are disposed on a blue LED epitaxial wafer, wherein micro holes are formed through etching in the structures. Every 2*2 table structures constitute an RGB pixel unit. Among the four micro holes, three of the holes are filled with red light, green light and yellow light quantum dots respectively, and one of the holes emits (Continued)

blue light/is filled with a blue light quantum dot. Micro holes in a silicon wafer are formed through etching with a deep silicon etching technology; the micro holes in the silicon wafer are aligned with quantum dot filling areas on a micro-LED.

15 Claims, 17 Drawing Sheets

(51) Int. Cl.
    *H01L 33/32*      (2010.01)
    *H01L 33/40*      (2010.01)

(58) Field of Classification Search
    USPC .......................................................... 257/79
    See application file for complete search history.

(56) References Cited

FOREIGN PATENT DOCUMENTS

| | | | |
|---|---|---|---|
| CN | 105514302 | A | 4/2016 |
| CN | 106696501 | A | 5/2017 |
| CN | 107170876 | A | 9/2017 |
| CN | 107331758 | A | 11/2017 |
| CN | 108511390 | A | 9/2018 |
| CN | 108878469 | A | 11/2018 |
| CN | 208489225 | U | 2/2019 |
| CN | 109935614 | A | 6/2019 |
| KR | 20180061093 | A | 6/2018 |

\* cited by examiner

MICRO PANCHROMATIC QLED ARRAY DEVICE BASED ON QUANTUM DOT TRANSFER PROCESS OF DEEP SILICON ETCHING TEMPLATES, AND PREPARATION METHOD THEREFOR

CROSS REFERENCE TO THE RELATED APPLICATIONS

This application is the national stage entry of International Application No. PCT/CN2019/116991, filed on Nov. 11, 2019, which is based upon and claims priority to Chinese Patent Application No. 201910278874.6, filed on Apr. 9, 2019, the entire contents of which are incorporated herein by reference.

TECHNICAL FIELD

The present invention relates to a micro panchromatic QLED array device based on a quantum dot transfer process of deep silicon etching templates, and a preparation method therefor and belongs to the technical field of semiconductor lighting and display.

BACKGROUND

As a lighting source widely used at present, light emitting diodes (LEDs), compared with traditional lighting sources, have the advantages of high efficiency, high resistance to impacts and quakes, high reliability, long service life, green and environmental protection, etc. III nitride materials are direct-gap semiconductors, of which the band gap covers infrared, visible light, and ultraviolet bands, so that they become major materials used at present in solid efficient lighting technologies. Compared with traditional incandescent lighting, LED light sources have the advantages of use of a low-voltage power supply, low energy consumption, high adaptability, high stability, short responding time, prevention of environmental pollution, multi-color lighting, etc. Despite of relatively higher cost than current lighting appliances, they are still deemed as good lighting devices. A white LED used in lighting can be realized by the following two modes: (1) a blue LED is matched with fluorescent powder to form white light; and (2) multiple monochromatic lights are mixed, namely an RGB-LED. The second mode can help obtain lighting quality with higher quantum efficiency.

In recent years, research on the LED has developed rapidly. Specifically, micro-LEDs have become a hot topic in current research and application due to their advantages of quick responding, low working voltages, stable and reliable performance, high lighting efficiency, wide scopes of working temperatures, etc. They have been applied in extensive fields such as flat panel display, televisions, military affairs, communications, criminal affairs, medical science, fire control, aerospace, satellite positioning, instruments and apparatus, and palm computers. The micro-LEDs have higher brightness, better lighting efficiency and lower power consumption compared to the existing OLED technology. Because of the outstanding features, the micro-LEDs can realize better display effects in devices such as televisions. At present, a micro pillar structure is mainly adopted for the micro-LEDs as it is advantageous to some extent in many aspects such as light output and transfer of electroluminescence spectra. However, common micro-LEDs face huge difficulties in realization of multi-color display. For example, due to the high technological complexity, filling and transfer of multi-color quantum dots can hardly be achieved. Therefore, a novel micro-LED with micro holes is used. Compared to the micro pillar structure, a micro hole structure can protect quantum dots, reduce physical damage brought by external environments, enlarge a contact area between a quantum well and quantum dots and thus realize color conversion better. A preparation method for a micro panchromatic QLED array device based on a quantum dot transfer process of deep silicon etching templates is also proposed. Micro processing is used in the whole process. The quantum dots are transferred to the micro-LED for preparation of a QLED, wherein the cost is low, operability is high, the yield is high, and the LED panchromatic display can be realized.

SUMMARY

The present invention aims to prepare a micro panchromatic QLED array device with a quantum dot transfer process of deep silicon etching templates.

Objectives of the present invention are realized by the following technical scheme:

A micro panchromatic QLED array device based on a quantum dot transfer process of deep silicon etching templates is provided, wherein a substrate material of the device is a standard blue/violet LED epitaxial wafer; array-type square table structures which pass through a p-type GaN layer and a quantum well active layer and are deep to an n-type GaN layer are formed through etching in the QLED array device; the square table structures are mutually isolated; each square table constitutes a micro-LED; and micro holes which are deep to the p-type GaN layer/quantum well active layer/n-type GaN layer are formed through etching in each square table to form a micro hole array.

The device further includes a p-type array electrode which is evaporated on the p-type GaN layer of the micro hole array, and an n-type electrode which is evaporated on the n-type GaN layer.

Every 2*2 square table structures constitute an RGB pixel unit, wherein among four micro holes of each RGB pixel unit, one is filled with a red light quantum dot, one is filled with a green light quantum dot, one is filled with a yellow light quantum dot, and one emits blue light/is filled with a blue light quantum dot in a violet LED epitaxial wafer micro hole.

In each RGB pixel unit, a rectangular isolation slot etched to the n-type GaN layer is configured between every two adjacent square tables, and the isolation slot is filled with a light absorption material for light isolation.

Each micro hole is filled with the red light/green light/yellow light/blue light quantum dot by each of the deep silicon etching templates. The isolation slot has three functions, wherein (1) the isolation slot is configured to isolate the adjacent square tables; (2) side wall damage caused by etching of the square tables is eliminated, leak currents of a micro hole LED are reduced, and lighting performance is increased; and (3) light isolation is realized. The isolation slot is filled with a light absorption material, so that light emitted by a quantum well on the side wall of the square table can be absorbed; blue light emitted by the quantum well is prevented from influencing lighting of the quantum dots; and mutual influences of light of different colors emitted by different micro hole arrays are also prevented.

Preferably, the deep silicon etching template is formed by adopting a deep silicon etching technology to etch a silicon wafer through so as to form a hollow square hole structure and a "+"-shaped alignment mark, corresponding to the position of the micro hole filled with the red light/green light/yellow light/blue light quantum dot, on the surface of the silicon wafer; a "+"-shaped alignment mark is also disposed at a corresponding position on a surface of a micro-LED array device, so that the deep silicon etching template is aligned with the micro-LED array device; and then, the QLED device is prepared through spin-coating of the quantum dots, wherein the "+"-shaped mark may be disposed at each of four corners or diagonal corners or one corner of each array.

Preferably, the red light quantum dot is a CdSe/ZnS quantum dot with an II-VI core shell structure or a perovskite $CsPbBr_3$ quantum dot.

Preferably, the green light quantum dot is a CdSe/ZnS quantum dot with an II-VI core shell structure or a perovskite $CsPbBr_3$ quantum dot.

Preferably, the yellow light quantum dot is a CdSe/ZnS quantum dot with an II-VI core shell structure or a perovskite $CsPbBr_3$ quantum dot.

Preferably, an area of the micro hole array is larger than or equal to 4 inches; a diameter of each micro hole is 20-100 μm; a cycle is 100-200 μm; an interval between the micro-LEDs is 80-100 μm; and a depth of each micro hole is 200 nm to 1.5 μm.

Preferably, the isolation slot which is deep to the n-type GaN layer is disposed between the adjacent micro hole tables formed through etching in the micro panchromatic QLED array device; the isolation slot has a width of 10-20 μm, and a length of being equal to an edge length of the square table; and the isolation slot is filled with a light absorption material, that is Vantablack or silver, for isolation of light of different colors.

The present invention also discloses a preparation method for the micro panchromatic QLED array device, wherein the method includes the following steps:

1) evaporating a dielectric layer on a blue LED epitaxial wafer by a PECVD technology;

2) spin-coating a surface of the dielectric layer with a photoresist layer and carrying out prebaking on the photoresist layer, using an ultraviolet lithography technology to transfer ordered square table array graphs on a photoetching plate, graphs of isolation slots which separate adjacent micro hole regions in square tables and graphs of "+"-shaped alignment marks between the adjacent square tables to the photoresist layer, and then carrying out development and post-baking;

3) using an RIE technology to introduce $O_2$ to remove a few of photoresist residual layers in areas where most of a photoresist is removed through development, using a PVD process to evaporate a metal mask layer, and then carrying out stripping to remove the photoresist layer and a metal film layer on the photoresist layer and obtain a large area of the ordered metal square table array graphs, isolation slot graphs and "+"-shaped alignment mark graphs between the adjacent square tables;

4) using the RIE technology to carry out longitudinal etching of the dielectric layer with metal as a mask, and transferring a metal square table array structure, an isolation slot structure and a "+"-shaped alignment mark structure between the adjacent square tables to the dielectric layer;

5) using an ICP technology to carry out anisotropic etching of a p-type GaN layer and a quantum well layer with metal as a mask, and transferring a metal square table array structure, an isolation slot structure between adjacent micro hole regions and "+"-shaped alignment marks between the adjacent square tables to an n-type GaN layer;

6) using a wet etching method to remove the metal mask layer and the dielectric layer on the square table array structure, the isolation slot structure between the adjacent micro hole regions and the graphs of the "+"-shaped alignment marks between the adjacent square tables, forming GaN square table array structures which are mutually isolated and repairing etching damage on GaN and side walls of a quantum well;

7) preparing a micro hole structure, wherein the PECVD technology is firstly adopted to evaporate the dielectric layer on the GaN square table array structure, the surface of the dielectric layer is spin-coated with the photoresist, and prebaking is carried out thereon; the ultraviolet lithography technology and a photoetching plate are adopted to realize overlaying on the photoresist of the square table array structure to form micro hole graphs; the RIE technology is adopted at first to etch the dielectric layer, then the ICP technology is adopted to etch the p-type GaN layer; and the micro hole array is obtained finally, wherein a depth of each micro hole can be etched to the p-type GaN layer, the quantum well layer or the n-type GaN layer;

8) using wet etching to remove the dielectric layer on the square table array structure and the photoresist left on the dielectric layer, and repairing the etching damage on the GaN and surfaces and the side walls of the quantum well;

9) evaporating a dielectric layer again on the blue LED epitaxial wafer;

10) preparing an n-type electrode, wherein a surface of the dielectric layer is spin-coated with photoresist and the ultraviolet lithography technology is adopted to overlay an n-type electrode graph on a photoetching plate to the photoresist; the RIE technology is adopted, the dielectric layer is etched with the photoresist as a mask, and the n-type electrode graph is transferred to the n-type GaN layer; the PVD process is adopted to evaporate a metal layer as the n-type electrode; then, the photoresist and a metal film on the photoresist layer are stripped and removed, and a sample is cleaned and dried; and in the end, thermal annealing is carried out to realize ohmic contact between the metal and the n-type GaN;

11) preparing a p-type electrode, wherein spin-coating of a photoresist layer is carried out again, and the ultraviolet lithography technology and a photoetching plate are adopted to realize overlaying on the photoresist to form a p-type electrode graph; the RIE technology is adopted to etch a dielectric layer film with the photoresist as a mask, and the p-type electrode graph is transferred to the p-type GaN layer; then the PVD process is adopted to evaporate a metal layer as the p-type electrode; wet etching is adopted to remove the photoresist and a metal film layer on the photoresist layer, and a sample is cleaned and dried; and in the end, thermal annealing is carried out to realize ohmic contact between the metal and the p-type GaN;

12) filling an isolation slot with a light absorption material, carrying out spin-coating of a photoresist layer again, and using the ultraviolet lithography technology and a photoetching plate to realize overlaying on the photoresist to form an isolation slot graph; carrying out spin-coating of a layer of the light absorption material on a surface of the sample, wherein the light absorption material enters the isolation slot in regions without the photoresist; and then using wet etching to remove the photoresist and the light absorption material thereon, and cleaning and drying the sample; and 13) using the quantum dot transfer process of deep silicon etching templates to fill the micro holes with the quantum dots.

2. A preparation method for a hole-shaped deep silicon etching template in a quantum dot transfer process of a deep silicon etching template is provided, including:

1) intercepting a silicon wafer which is equal to or slightly larger than a square table array, spin-coating a surface of the silicon wafer with an AZ4620 positive photoresist, carrying out prebaking thereon, using the ultraviolet lithography technology to transfer a photoetching plate surface graph to the surface of the silicon wafer, and then carrying out development and post-baking; and 2) using the photoresist as a mask and using the deep silicon etching technology to etch the silicon wafer through, forming a hollow square hole structure and a "+"-shaped alignment mark at positions corresponding to the micro holes filled with the red light/green light/yellow light/blue light quantum dots on the surface of the silicon wafer, and making the red light/green light/yellow light/blue light deep silicon etching template.

Preferably, a square hole in the deep silicon etching template has an edge length of 90-180 μm, and a depth which may realize etching-through of the silicon wafer; and the thickness of the silicon wafer is 200-500 μm.

Preferably, the "+"-shaped alignment mark in the deep silicon etching template and the "+"-shaped alignment mark in the micro panchromatic QLED array device have a maximum length of 40 μm, and a maximum width of 20 μm.

3. A quantum dot transfer process of a deep silicon etching template is provided, including:

1) placing any of the red light/green light/yellow light deep silicon etching templates on the micro-LEDs, and aligning the "+"-shaped alignment mark on the silicon wafer with the "+"-shaped photoetching mark on the micro-LED array under a microscope;

2) spin-coating the micro-LED array with the quantum dots with a corresponding color by a hole-shaped structure on the deep silicon etching template, drying the micro-LED array device spin-coated with quantum dots, and taking down the deep silicon etching template; and 3) using the deep silicon etching templates of other two colors to repeat steps 1)-2) twice, so as to fill the micro holes of each RGB pixel unit with the quantum dots of the other two colors, thereby preparing and forming the QLED array device.

Processes of quantum dots filling by a quantum dot transfer process of deep silicon etching templates particularly include:

A, dissolving a red light quantum dot, a green light quantum dot and a yellow light quantum dot in a solvent respectively;

B, placing each deep silicon etching template above micro-LEDs, and aligning a "+"-shaped alignment mark on a silicon wafer with a "+"-shaped photoetching mark on a micro-LED array device under a microscope;

C, moving a stage of the microscope, and spin-coating the deep silicon etching templates with the quantum dots, wherein the quantum dots enter micro holes in a micro-LED array via micro holes in the silicon wafer;

D, placing the micro-LED array device to which a quantum dot solution is sprayed on a drying table for drying; and E, taking down the deep silicon etching templates to prepare a QLED, so that multi-color display of the QLED device is realized.

Preferably, the solvent is methylbenzene, chloroform or hexane.

Preferably, the n-type electrode is metal Ti/Al/Ni/Au, and the p-type electrode is metal Ni/Au.

Preferably, a thickness of the dielectric layer is 150-250 nm with a material of $SiO_2$.

Preferably, a thickness of the metal mask layer is 30-100 nm, and Ni or Cr is selected and used.

The present invention also discloses a deep silicon etching template configured for quantum dot filling, wherein the deep silicon etching template is a silicon wafer; on a surface of the silicon wafer, a deep silicon etching technology is adopted to form a hollow square hole structure and a "+"-shaped alignment mark corresponding to positions of micro holes to be filled with red light/green light/yellow light/blue light quantum dots; and a "+"-shaped alignment mark is also etched at a corresponding position on a surface of a micro-LED array device in need of filling of the red light/green light/yellow light/blue light quantum dots, so that the deep silicon etching template is aligned with the micro-LED array device.

Preferably, the "+"-shaped mark is disposed at each of four corners or diagonal corners or one corner of the deep silicon etching template.

Preferably, the hollow hole structure is a square hole, a rectangular hole or a round hole or an elliptic hole, and the hole is sized to completely expose the micro hole to be filled with the quantum dot.

The present invention further discloses a method for quantum dot filling with a deep silicon etching technology, including the following steps:

1) intercepting a silicon wafer which is equal to or slightly larger than a top surface of a device to be filled with quantum dots, spin-coating a surface of the silicon wafer with a photoresist, carrying out prebaking thereon, using an ultraviolet lithography technology to transfer a graph on the top surface of the device to be filled with the quantum dots, which is located on a photoetching plate, to the surface of the silicon wafer, and then carrying out development and post-baking;

2) using the photoresist as a mask, using the deep silicon etching technology to etch the silicon wafer through, forming a hollow square hole structure and a "+"-shaped alignment mark corresponding to a position of a micro hole filled with the red light and/or green light and/or yellow light quantum dot on the surface of the silicon wafer, making a corresponding red light and/or green light and/or yellow light deep silicon etching template, and etching a "+"-shaped alignment mark at a corresponding position on the top surface of the device as well;

3) placing the red light deep silicon etching template on the top surface of the device to be filled with the quantum dots, and carrying out alignment between the "+"-shaped alignment mark on the silicon wafer and the "+"-shaped photoetching mark on the top surface of the device under a microscope;

4) by a hole-shaped structure on the red light/green light/yellow light deep silicon etching template, spin-coating the top surface of the device with the red light/green light/yellow light quantum dot, drying the device spin-coated with quantum dots, and then taking down the red light/green light/yellow light deep silicon etching template; and 5) carrying out filling of quantum dots of other colors with steps same as steps (3)-(4), wherein quantum dot filling holes in the top surface of the device are filled with the red light and/or green light and/or yellow light quantum dots, and filling is completed.

The present invention designs and prepares the micro panchromatic QLED array device based on the quantum dot transfer process of the deep silicon etching templates. By the quantum dot transfer process of the deep silicon etching templates, the micro holes corresponding to each 2×2 RGB pixel point are filled with the red light quantum dot, the green light quantum dot and the yellow light quantum dot of CdSe/ZnS with an II-VI core shell structure. As activated by a blue LED, the quantum dots of different colors emit red, green and yellow light, so that multi-color display of each RGB pixel point is realized. Compared with an ordinary micro-LED, in which the surface of p-type GaN are directly spin-coated with quantum dots, the micro hole structure can protect the quantum dots, reduce physical damage brought by external environments, enlarge a contact area between a quantum well and the quantum dots and thus realize color conversion better. In the present invention, compared with a conventional ink-jet printing quantum dot filling method at present, a micro processing method of the deep silicon etching templates of the micro holes is adopted for spin-coating of the quantum dots. Operations are simple. Spin-coating quality is high. Requirements for devices are low. Existing micro processing devices which are commonly used at present can be adopted to complete spin-coating. It is unnecessary to purchase dedicated ink jet printing devices, so the cost is low. The micro processing technology is adopted to manufacture the micro-LED array device, which makes greater breakthroughs in micro-LED research. The prepared QLED array device realizes four-color display, thereby promoting development of semiconductor display.

DETAILED DESCRIPTION OF THE EMBODIMENTS

The technical solutions in the embodiments of the present invention are clearly and completely described in the following with reference to the accompanying drawings in the embodiments of the present invention. Apparently, the embodiments described are merely some rather than all of the embodiments of the present invention. All other embodiments obtained by persons of ordinary skill in the art based on the embodiments in the present invention without making creative efforts shall fall within the protection scope of the present invention.

Figure 1:
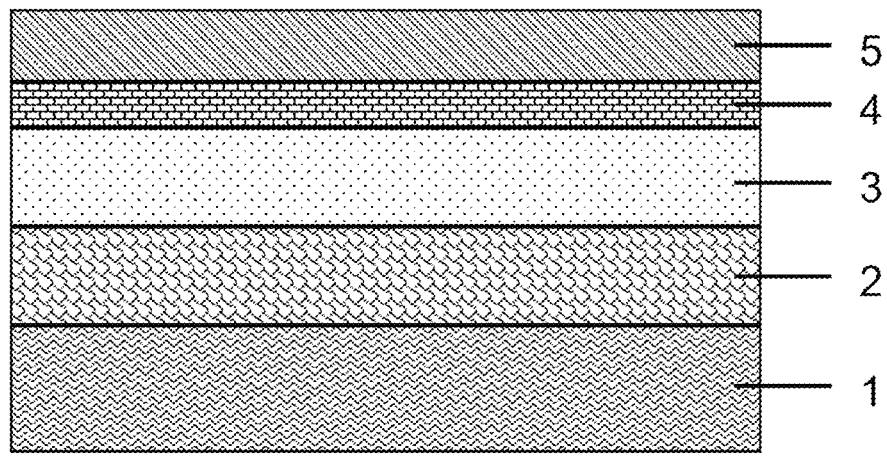
FIG. 1 is a schematic structural diagram showing an $In_xGa_{1-x}N$/GaN quantum well LED substrate developing with an MOCVD method.

Embodiment 1 A Micro Panchromatic QLED Array Device Based on a Quantum Dot Transfer Process of Deep Silicon Etching Templates In the present embodiment, an epitaxial wafer structure selected for a substrate material is shown in FIG. 1. A standard blue LED epitaxial wafer with a p-n structure includes a sapphire substrate 1; a GaN buffer layer 2 growing on the sapphire substrate; an n-type GaN layer 3 growing on the buffer layer; a quantum well active layer 4 growing on the n-type GaN layer; and a p-type GaN layer 5 growing on the quantum well active layer.

Figure 2:
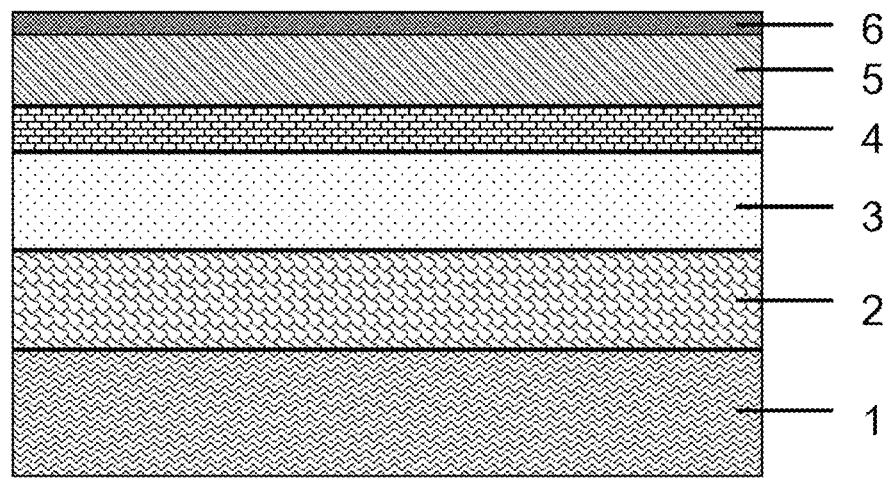
FIG. 2 is a schematic structural diagram showing a micro panchromatic QLED array device based on a quantum dot transfer process of deep silicon etching templates, which is obtained by a micro-LED array and step (1) of a preparation method thereof according to the present invention.

A specific preparation method for a micro-LED array device is as follows:

(1) As shown in FIG. 2, a plasma enhanced chemical vapor deposition (PECVD) technology is adopted to evaporate a 150 nm thick $SiO_2$ dielectric layer 6 on the $In_xGa_{1-x}N$/GaN quantum well blue LED epitaxial wafer. A growth mode of $SiO_2$ with the PECVD is as follows: a mixed gas of 5% $SiH_4/N_2$ and $N_2O$ is introduced into a reaction chamber, wherein flow rates are 100 sccm and 450 sccm, respectively. Under the conditions of pressure intensity of 300 mTorr, a power of 10 W and a temperature of 350° C., $SiO_2$ is deposited on the surface of the epitaxial wafer through a reaction of $SiH_x+O \rightarrow SiO_2$ ($+H_2$) for the duration of 7 minutes and 10 seconds.

Figure 3:
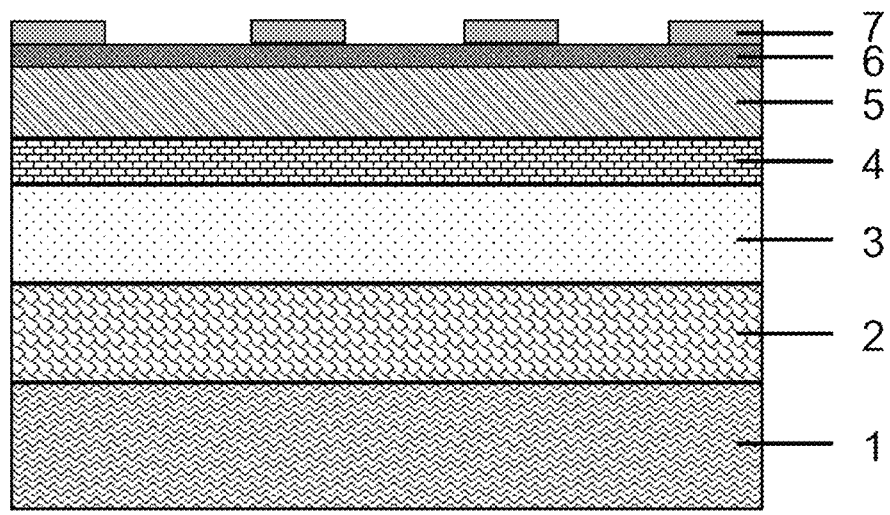
FIG. 3 is a schematic structural diagram showing a micro panchromatic QLED array device based on a quantum dot transfer process of deep silicon etching templates, which is obtained by a micro-LED array and step (2) of a preparation method thereof according to the present invention.

(2) As shown in FIG. 3, the $SiO_2$ dielectric layer is spin-coated with a photoresist 7, and prebaking is carried out under 90° C. for the duration of 10 minutes; then, an ultraviolet lithography technology is adopted to transfer graphs on a photoetching plate to the photoresist, so that ordered square table array graphs, graphs of rectangular isolation slots which divide adjacent micro hole regions in square tables, and "+"-shaped alignment marks on four corners of each array between the adjacent square tables are formed; then development is carried out; and post-baking is carried out under 110° C. for 1 minute.

Figure 4:
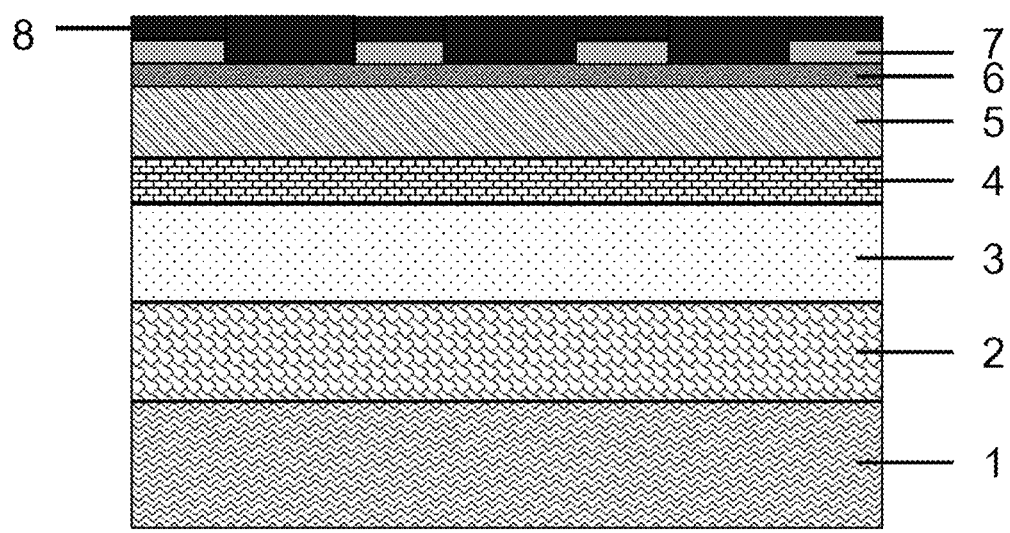
FIGS. 4-5 are schematic structural diagrams showing a micro panchromatic QLED array device based on a quantum dot transfer process of deep silicon etching templates, which is obtained by a micro-LED array and each operation in step (3) of a preparation method thereof according to the present invention.
Figure 5:
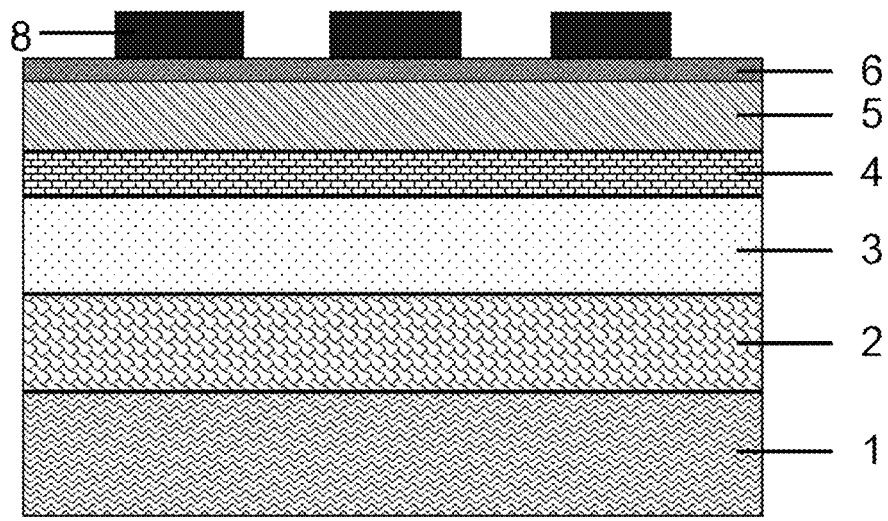

(3) A reactive ion etching (RIE) technology is adopted and $O_2$ is introduced at a gas flow rate of 10 sccm, pressure intensity of 3 Pa and a power of 50 W. A residual layer of the photoresist is removed within 20 seconds. Then, a physical vapor deposition (PVD) process is adopted to evaporate metal Ni of 30 nm thick as a mask 8 on the surface of a sample. As shown in FIG. 4, an evaporation rate is 0.5 A/s. Then, an acetone solution is adopted for ultrasonic treatment for 10 minutes to strip the photoresist layer 7 and the metal Ni film 8 on the photoresist layer. A large area of the ordered square table array graphs, the graphs of the rectangular isolation slots between the adjacent micro holes and "+"-shaped alignment marks between the adjacent tables are obtained. An interval between the adjacent tables is 80 μm; the width of the isolation slots is 10 μm; and the maximum length of the "+"-shaped alignment marks is 40 μm, and the maximum width of the "+"-shaped alignment marks is 20 μm, as shown in FIG. 5.

Figure 6:
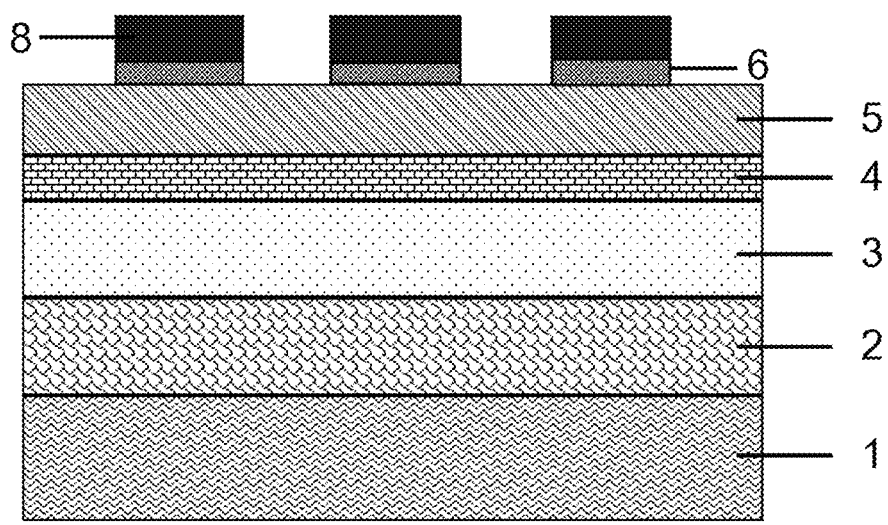
FIG. 6 is a schematic structural diagram showing a micro panchromatic QLED array device based on a quantum dot transfer process of deep silicon etching templates, which is obtained by a micro-LED array and step (4) of a preparation method thereof according to the present invention.

(4) As shown in FIG. 6, the RIE technology is adopted to introduce a mixed gas of $CF_4$ and $O_2$ into the reaction chamber, wherein flow rates of the gases are $CF_4$: 30 sccm and $O_2$: 10 sccm; the power is 150 W; pressure intensity is 4 Pa; and the etching duration is 3 minutes. With metal Ni as the mask, longitudinal etching is carried out on the dielectric layer $SiO_2$. Metal square table structures, rectangular isolation slot structures between the adjacent micro holes and the "+"-shaped alignment marks between the adjacent square tables are transferred to the dielectric layer 6.

Figure 7:
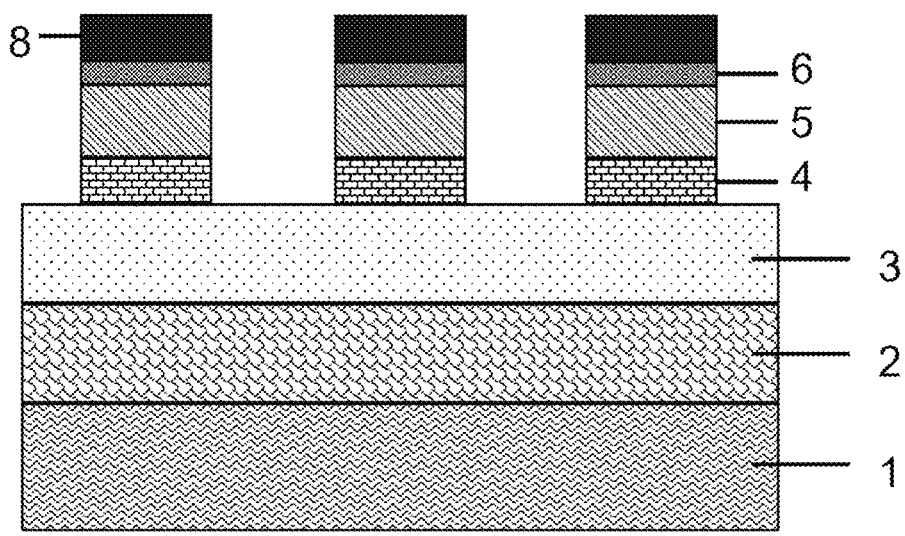
FIG. 7 is a schematic structural diagram showing a micro panchromatic QLED array device based on a quantum dot transfer process of deep silicon etching templates, which is obtained by a micro-LED array and step (5) of a preparation method thereof according to the present invention.

(5) As shown in FIG. 7, an inductivity coupled plasma (ICP) technology is adopted to introduce a mixed gas of $Cl_2$ and $BCl_3$ into the reaction chamber. With metal 8 and the dielectric layer 6 as the mask, anisotropic etching is carried out on the p-type GaN layer 5 and the quantum well layer 4 till the n-type GaN layer 3, so that a large area of the mutually isolated square table structures, the rectangular isolation slots between the adjacent micro holes and the "+"-shaped alignment marks between the adjacent square tables are formed. Etching conditions are as follows: $Cl_2$: 24 sccm; $BCl_3$: 3 sccm; the ICP power is 600 W; the RF power is 10 W; the pressure intensity is 6.5 mTorr; the duration is 9 minutes and 30 seconds; the etching depth is about 950 nm; and an interval between the adjacent micro-LEDs formed is 80 μm.

Figure 8:
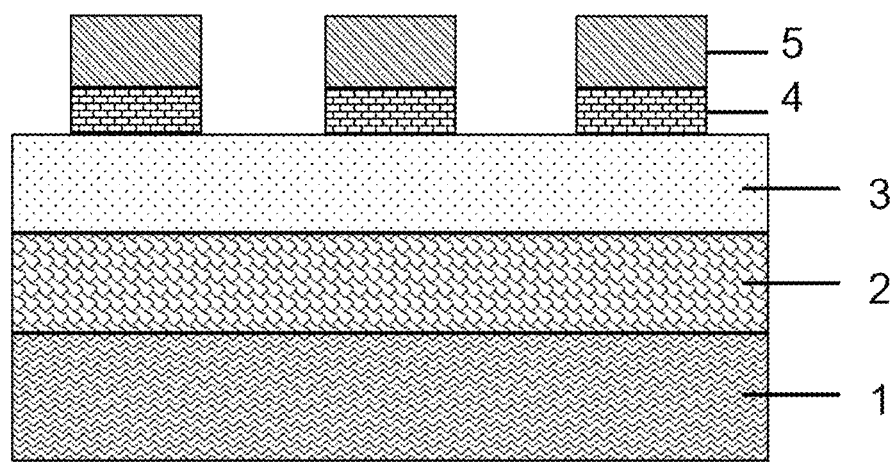
FIG. 8 is a schematic structural diagram showing a micro panchromatic QLED array device based on a quantum dot transfer process of deep silicon etching templates, which is obtained by a micro-LED array and step (6) of a preparation method thereof according to the present invention.

(6) As shown in FIG. 8, wet etching is adopted to remove the metal mask layer 8 and the dielectric layer 6. Specifically, the sample is soaked in a nitric acid aqueous solution and a buffer oxide etchant (BOE) in succession, wherein one duration is 1 minute and the other duration is 40 seconds, respectively. The soaking process can also reduce etching damage on GaN and side walls of the quantum well.

Figure 9:
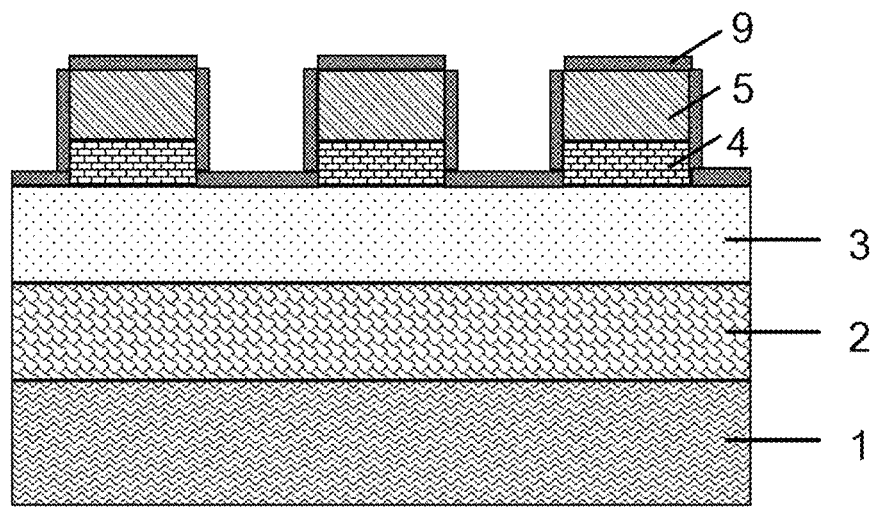
FIGS. 9-11 are schematic structural diagrams showing a micro panchromatic QLED array device based on a quantum dot transfer process of deep silicon etching templates, which is obtained by a micro-LED array and each operation in step (7) of a preparation method thereof according to the present invention.
Figure 10:
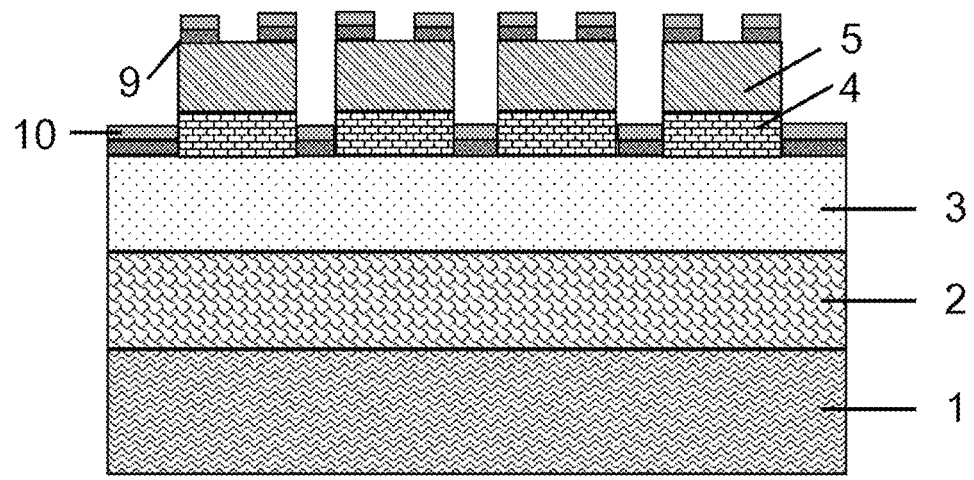
Figure 11:
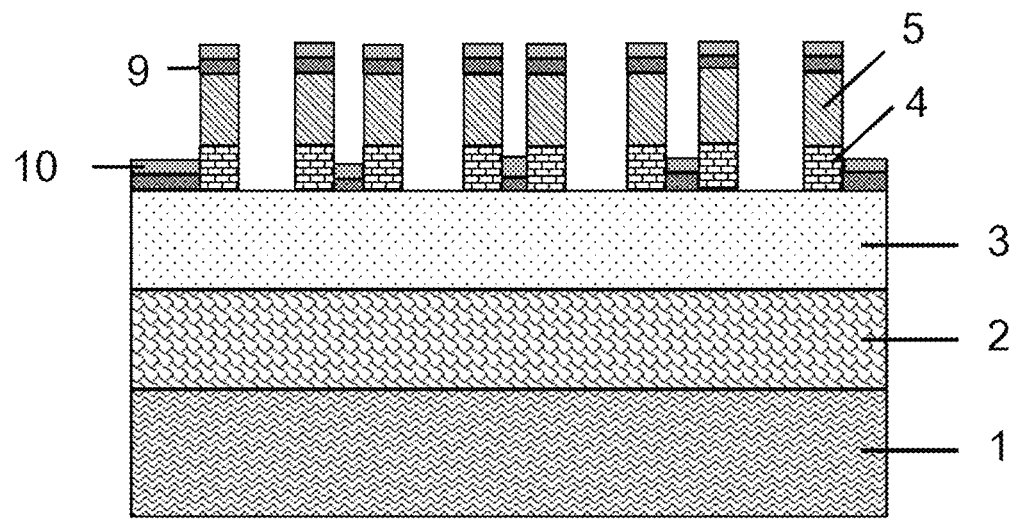

(7) As shown in FIG. 9, the PECVD technology is adopted to evaporate a 150 nm thick $SiO_2$ dielectric layer 9 as a mask. A mixed gas of 5% $SiH_4/N_2$ and $N_2O$ is introduced into the reaction chamber, wherein flow rates are 100 sccm and 450 sccm, respectively, the pressure intensity is 300 mTorr, the power is 10 W, the temperature is 350° C., and the duration is 7 minutes and 10 seconds. A $SiO_2$ layer is deposited on the surface of the sample through a reaction of $SiH_x+O \rightarrow SiO_2$ ($+H_2$). Then the surface of the sample is spin-coated with a photoresist layer 10, and prebaking is carried out under 90° C. for 10 minutes. Then the ultraviolet lithography technology and a photoetching plate are adopted for overlaying on the photoresist to form a micro hole graph with the diameter of 20 μm and a cycle of 100 μm. Development is carried out. Post-baking is carried out under 110° C. for 1 minute. Then, as shown in FIG. 10, the RIE technology is adopted to introduce a mixed gas of $CF_4$ and $O_2$ into the reaction chamber, wherein flow rates of the gases are $CF_4$: 30 sccm and $O_2$: 10 sccm; the power is 150 W; the pressure intensity is 4 Pa; and the etching duration is 3 minutes. A photoresist 10 is used as a mask for longitudinal etching of the dielectric layer $SiO_2$ 6. As shown in FIG. 11, the ICP technology is adopted to introduce a mixed gas of $Cl_2$ and $BCl_3$ into the reaction chamber. The photoresist 10 and the dielectric layer 9 are taken as masks for anisotropic etching of the p-type GaN layer 5. Etching conditions are as follows: $Cl_2$: 24 sccm; $BCl_3$: 3 sccm; the ICP power is 600 W; the RF power is 10 W; the pressure intensity is 6.5 mTorr; the duration is 2 minutes; and the etching depth is about 200 nm. A micro hole array with the diameter of 20 μm, a cycle of 100 μm and a depth of 200 nm is obtained.

Figure 12:
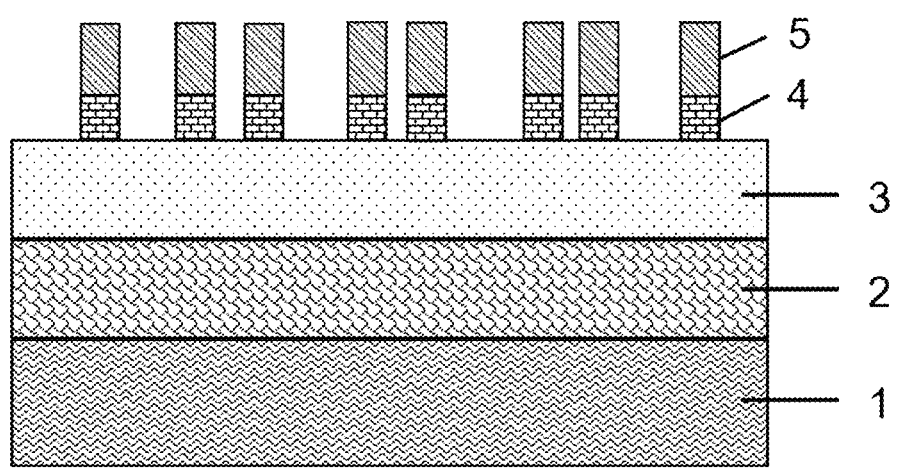
FIG. 12 is a schematic structural diagram showing a micro panchromatic QLED array device based on a quantum dot transfer process of deep silicon etching templates, which is obtained by a micro-LED array and step (8) of a preparation method thereof according to the present invention.

(8) As shown in FIG. 12, wet etching is used. The sample is soaked in the BOE for 1 minute. The $SiO_2$ dielectric layer 9 and a residual photoresist layer 10 on the dielectric layer are removed. In addition, etching damage on GaN and the surface and side walls of the quantum well is reduced.

Figure 13:
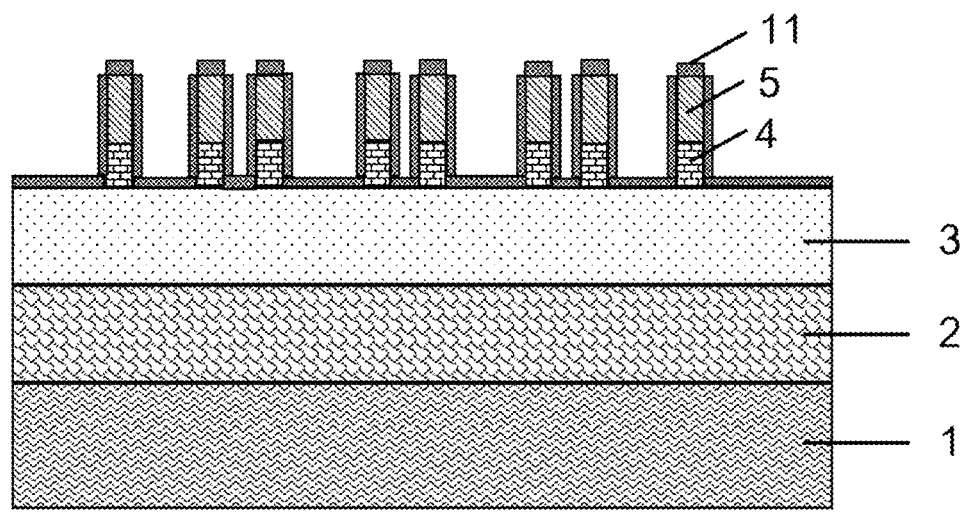
FIG. 13 is a schematic structural diagram showing a micro panchromatic QLED array device based on a quantum dot transfer process of deep silicon etching templates, which is obtained by a micro-LED array and step (9) of a preparation method thereof according to the present invention.

(9) As shown in FIG. 13, the PECVD technology is adopted to evaporate a 150 nm thick $SiO_2$ dielectric layer 11 on the surface of the sample. A mixed gas of 5% $SiH_4/N_2$ and $N_2O$ is introduced into the reaction chamber, wherein flow rates are 100 sccm and 450 sccm, respectively, the pressure intensity is 300 mTorr, the power is 10 W, the temperature is 350° C., and the duration is 7 minutes and 10 seconds. A $SiO_2$ layer is deposited on the surface of the sample through a reaction of $SiH_x+O \rightarrow SiO_2 (+H_2)$.

Figure 14:
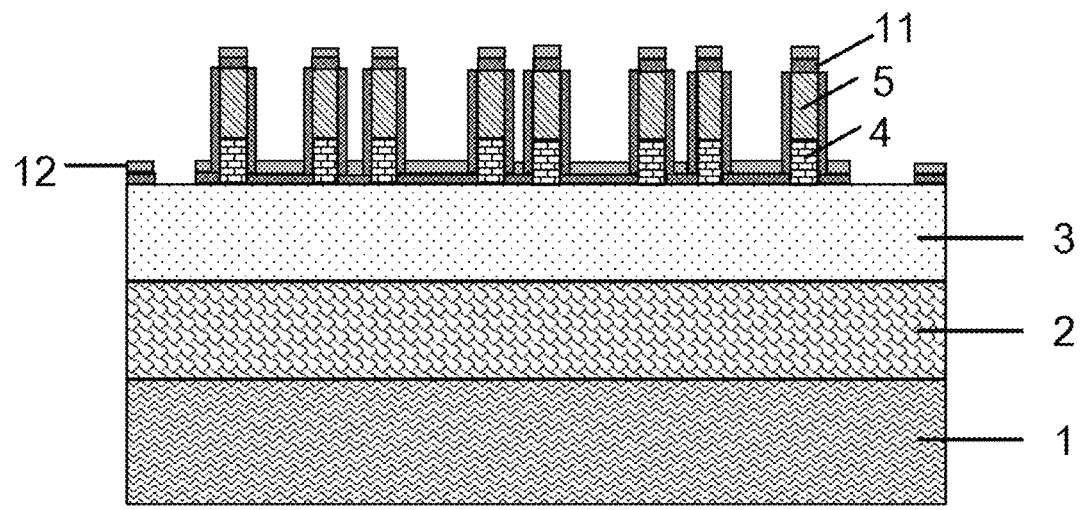
FIGS. 14-15 are schematic structural diagrams showing a micro panchromatic QLED array device based on a quantum dot transfer process of deep silicon etching templates, which is obtained by a micro-LED array and each operation in step (10) of a preparation method thereof according to the present invention.
Figure 15:
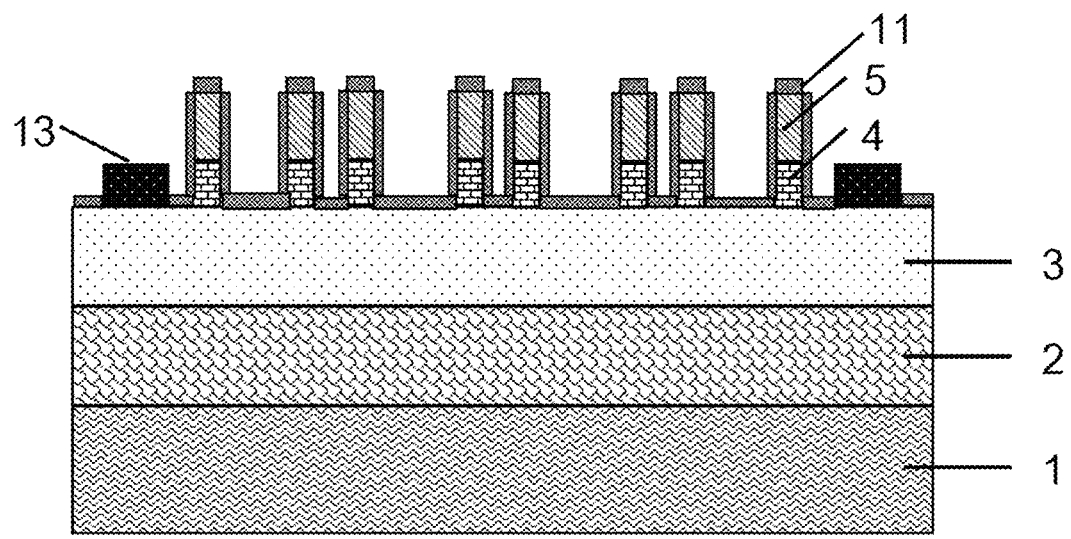

(10) An n-type electrode is prepared. The surface of the sample is spin-coated with a photoresist layer 12, and prebaking is carried out under 90° C. for 10 minutes. The ultraviolet lithography technology is adopted to overlay an n-type electrode graph on the photoetching plate to the photoresist. Development is carried out. Post-baking under 110° C. is carried out for 1 minute. Then, as shown in FIG. 14, the RIE technology is adopted to introduce a mixed gas of $CF_4$ and $O_2$ into the reaction chamber, wherein flow rates of the gases are $CF_4$: 30 sccm and $O_2$: 10 sccm; the power is 150 W; the pressure intensity is 4 Pa; and the etching duration is 3 minutes. The photoresist 12 is taken as a mask for etching a $SiO_2$ dielectric layer film 11. The n-type electrode graph is transferred to n-type GaN 3. The PVD process is adopted to successively evaporate four metals of Ti, Al, Ni and Au on the surface of the sample, with thicknesses of 20 nm, 50 nm, 30 nm and 100 nm, respectively, and a product is taken as an n-type electrode 13. Then, as shown in FIG. 15, an acetone ultrasonic technology is adopted to strip the photoresist 12 and the metal film 13 on the photoresist layer. The sample is cleaned and dried. In the end, thermal annealing is carried out under $N_2$, a temperature of 750° C. and a duration of 30 seconds. In this way, ohmic contact between the metal Ti/Al/Ni/Au and the n-type GaN is realized.

Figure 16:
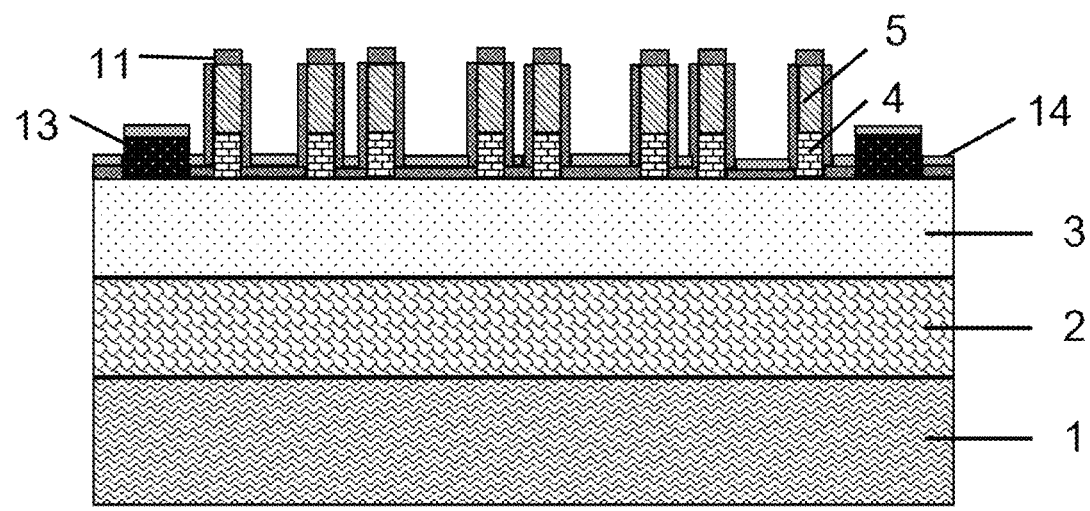
FIGS. 16-17 are schematic structural diagrams showing a micro panchromatic QLED array device based on a quantum dot transfer process of deep silicon etching templates, which is obtained by a micro-LED array and step (11) of a preparation method thereof according to the present invention.
Figure 17:
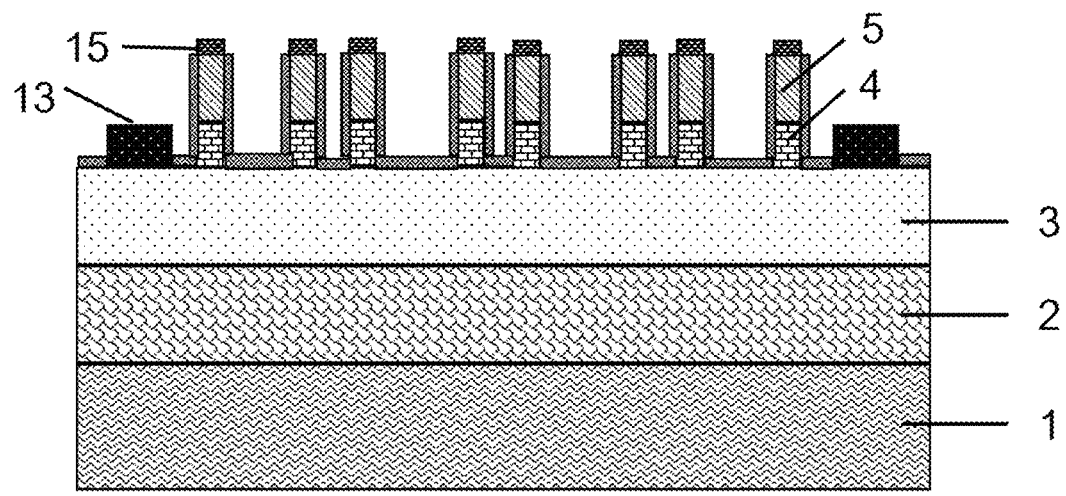

(11) A p-type electrode is prepared. As shown in FIG. 16, the surface of the sample is spin-coated with a photoresist layer 14, and prebaking is carried out under 90° C. for 10 minutes. The ultraviolet lithography technology is adopted to overlay a p-type electrode graph on the photoetching plate to the photoresist. Development is carried out. Post-baking under 110° C. is carried out for 1 minute. The RIE technology is adopted to introduce a mixed gas of $CF_4$ and $O_2$ into the reaction chamber, wherein flow rates of the gases are $CF_4$: 30 sccm and $O_2$: 10 sccm; the power is 150 W; the pressure intensity is 4 Pa; and the etching duration is 3 minutes. The photoresist 14 is taken as a mask for etching a $SiO_2$ dielectric layer film 11. The p-type electrode graph is transferred to p-type GaN 5. The PVD process is adopted to successively evaporate two metals of Ni and Au on the surface of the sample, with thicknesses of 150 nm and 200 nm, respectively, and a product is taken as a p-type electrode 15. An acetone ultrasonic technology is adopted to strip the photoresist 14 and the metal film 15 on the photoresist layer. The sample is cleaned and dried. In the end, thermal annealing is carried out under $N_2$, a temperature of 750° C. and a duration of 30 seconds. In this way, ohmic contact between the metal Ni/Au and the p-type GaN is realized, as shown in FIG. 17.

Figure 18:
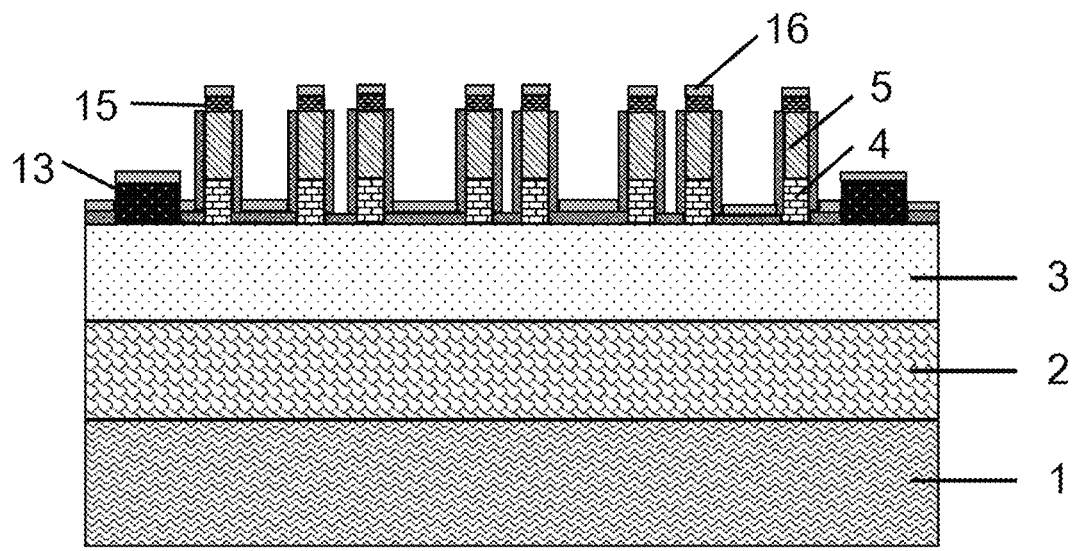
FIGS. 18-19 are schematic structural diagrams showing a micro panchromatic QLED array device based on a quantum dot transfer process of deep silicon etching templates, which is obtained by a micro-LED array and step (12) of a preparation method thereof according to the present invention.
Figure 19:
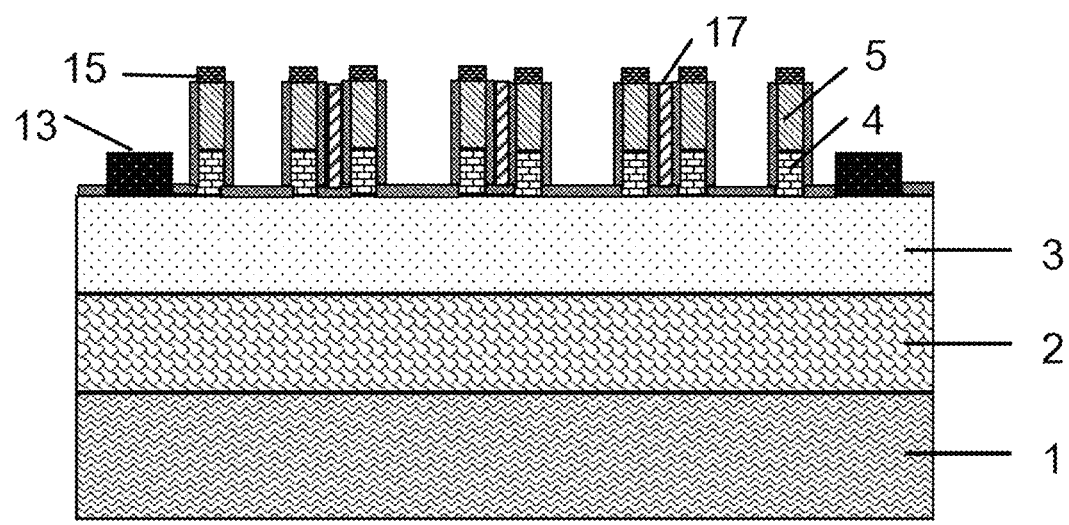

(12) The isolation slots are filled with light absorption materials. As shown in FIG. 18, the surface of the sample is spin-coated with a photoresist layer 16 again, and prebaking is carried out under 90° C. for 10 minutes. The ultraviolet lithography technology and the photoetching plate are adopted for overlaying on the photoresist to form graphs of the rectangular isolation slots. Development is carried out. Post-baking under 110° C. is carried out for 1 minute; the surface of the sample is spin-coated with a layer of light absorption material Vantablack 17, and the light absorption material enters the isolation slots in regions without the photoresist; then, through wet etching, the sample is soaked in the BOE for 1 minute, and the photoresist 16 and the light absorption material 17 thereon are removed. The sample is cleaned and dried, as shown in FIG. 19.

Figure 20:
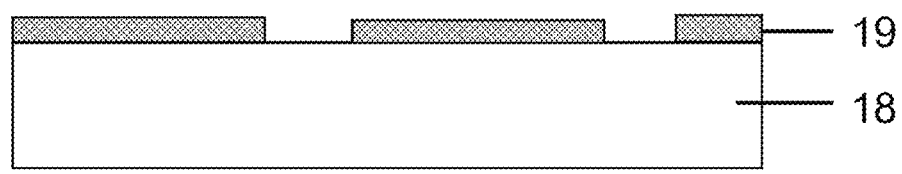
FIG. 20 is a schematic structural diagram showing a hole-shaped deep silicon etching template obtained by step (1) of a preparation method for the hole-shaped deep silicon etching templates in a quantum dot transfer process of deep silicon etching templates according to the present invention.

A preparation method for a hole-shaped deep silicon etching template in a quantum dot transfer process of deep silicon etching templates includes the following steps:

(1) A deep silicon etching template is prepared. The surface of a cleaned 200 μm thick silicon wafer 18 is spin-coated with an AZ4620 positive photoresist 19, and prebaking is carried out under 95° C. for 4 minutes. Then, an ultraviolet lithography technology is adopted to transfer graphs of periodical square holes in the surface of a photoetching plate and "+"-shaped alignment marks on four corners of each array to the surface of the silicon wafer. Development is carried out. Post-baking under 110° C. is carried out for 5 minutes. The edge length of the square holes is 90 μm. The rectangular "+"-shaped alignment marks are 40 μm long and 20 μm wide, as shown in FIG. 20.

Figure 21:
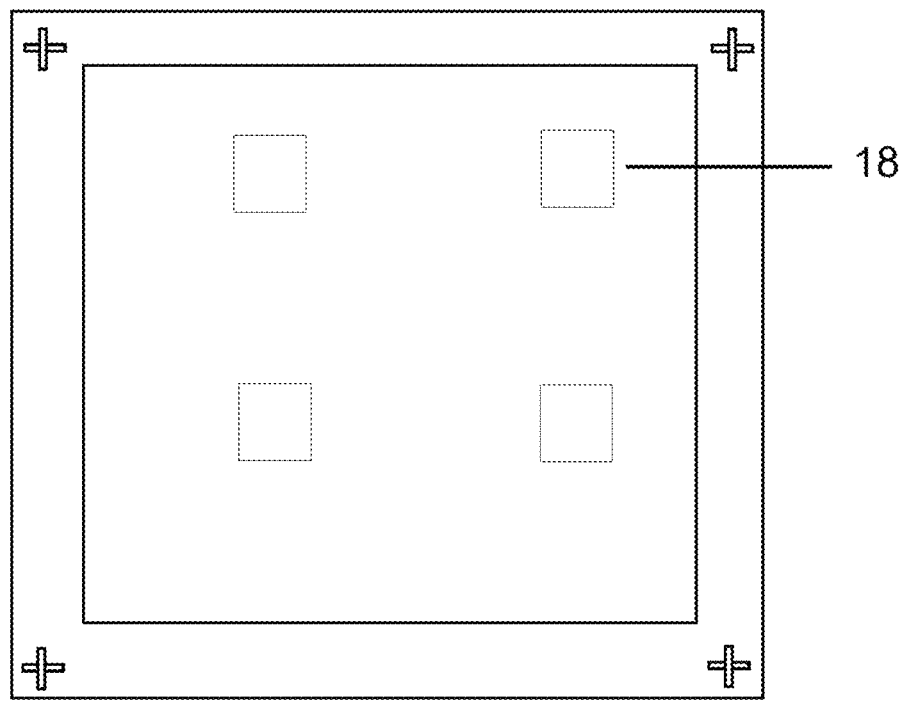
FIG. 21 is a schematic structural diagram showing a surface of a hole-shaped silicon wafer mask plate with four corners having "+"-shaped marks, obtained by step (2) of a preparation method for hole-shaped deep silicon etching templates in a quantum dot transfer process of deep silicon etching templates according to the present invention.

(2) The photoresist is taken as a mask. A deep silicon etching technology is adopted. Gases $C_4F_8$ and $SF_6$ are introduced into a reaction chamber for etching for 42 minutes and 40 seconds. The silicon wafer is etched through. Hollow square hole-shaped structures and "+"-shaped alignment marks are formed on the surface of the silicon wafer, as shown in FIG. 21.

Figure 22:
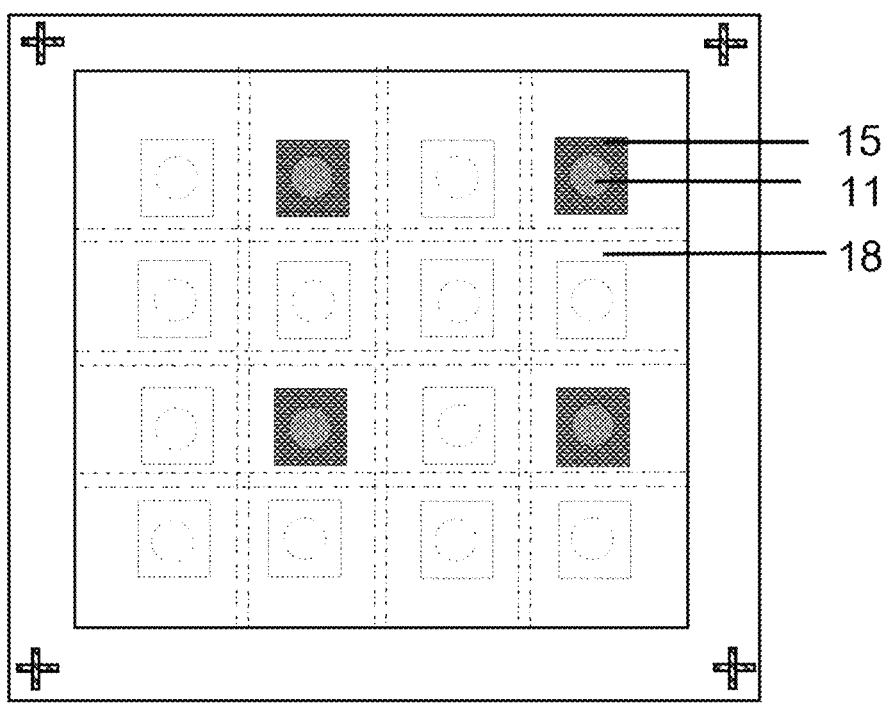
FIG. 22 is a schematic diagram showing alignment of a hole-shaped deep silicon etching template with four corners having "+"-shaped marks, obtained by step (1) of a quantum dot transfer process of deep silicon etching templates, and a micro-LED array device, according to the present invention.

A quantum dot transfer process of deep silicon etching templates includes the following steps:

(1) A deep silicon etching template is placed above micro-LEDs. A "+"-shaped alignment mark on a silicon wafer and a "+"-shaped photoetching alignment mark on a micro-LED array are aligned under a microscope, as shown in FIG. 22.

Figure 23:
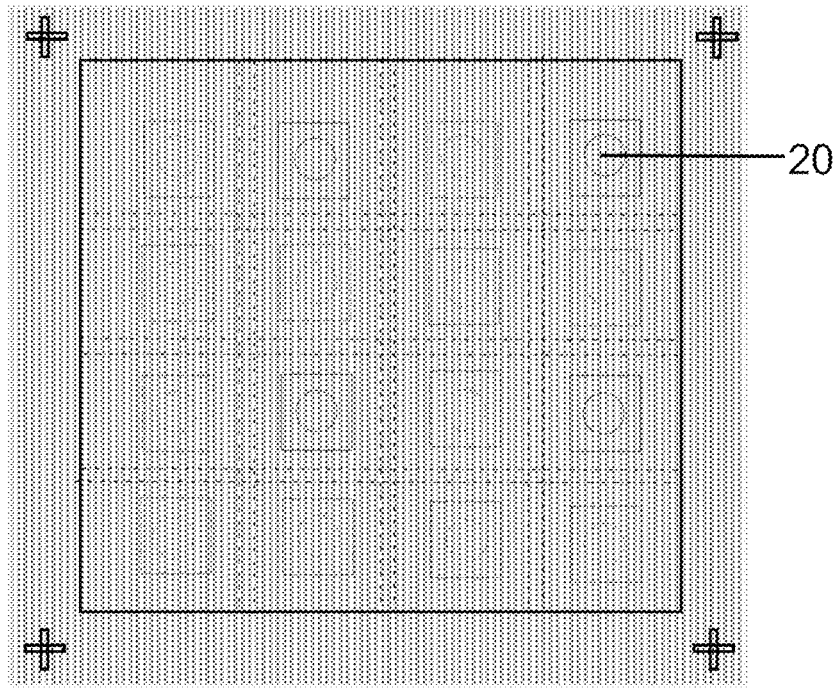
FIG. 23 is a schematic diagram showing a surface of a micro-LED array device obtained through spin-coating of a red light quantum dot on a hole-shaped deep silicon etching template with four corners having "+"-shaped marks, obtained by step (2) of a quantum dot transfer process of deep silicon etching templates according to the present invention.
Figure 24:
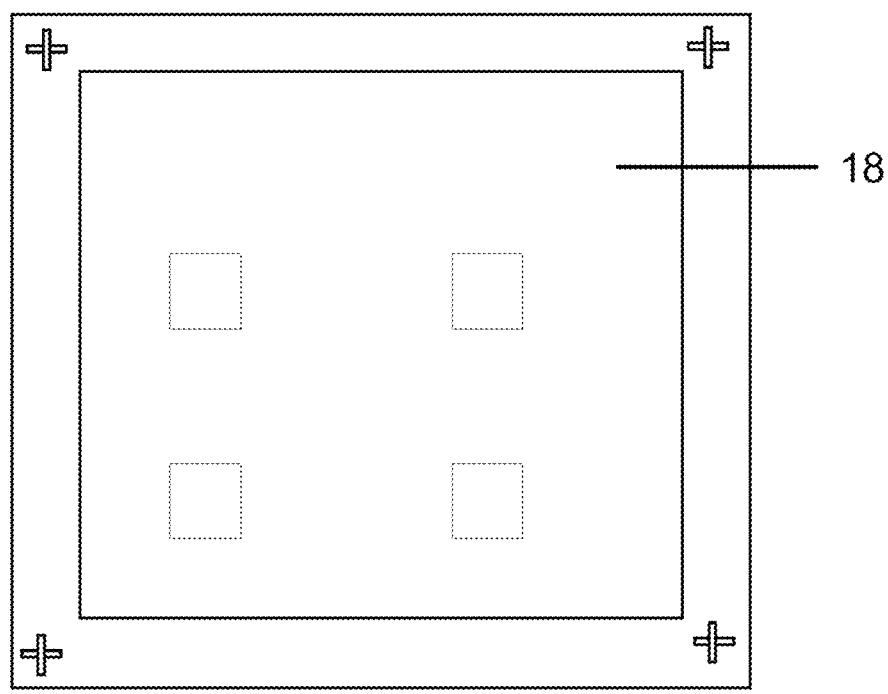
FIGS. 24-29 are schematic diagrams showing devices obtained by each step when steps (1)-(2) of a quantum dot transfer process are repeated twice and a position of a square hole in a deep silicon etching template with four corners having "+"-shaped marks is changed in step (3) of a quantum dot transfer process of deep silicon etching templates according to the present invention.
Figure 25:
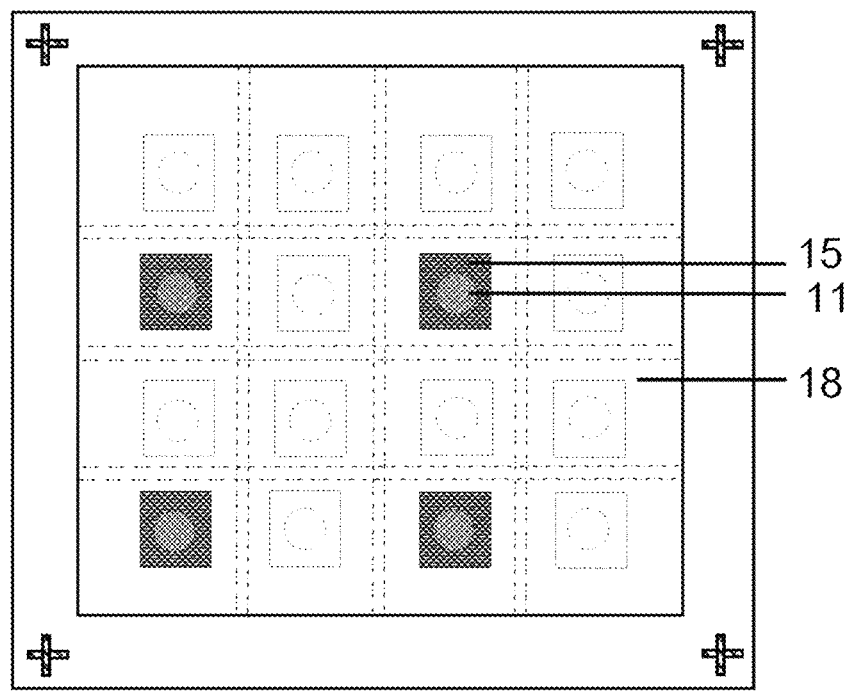
Figure 26:
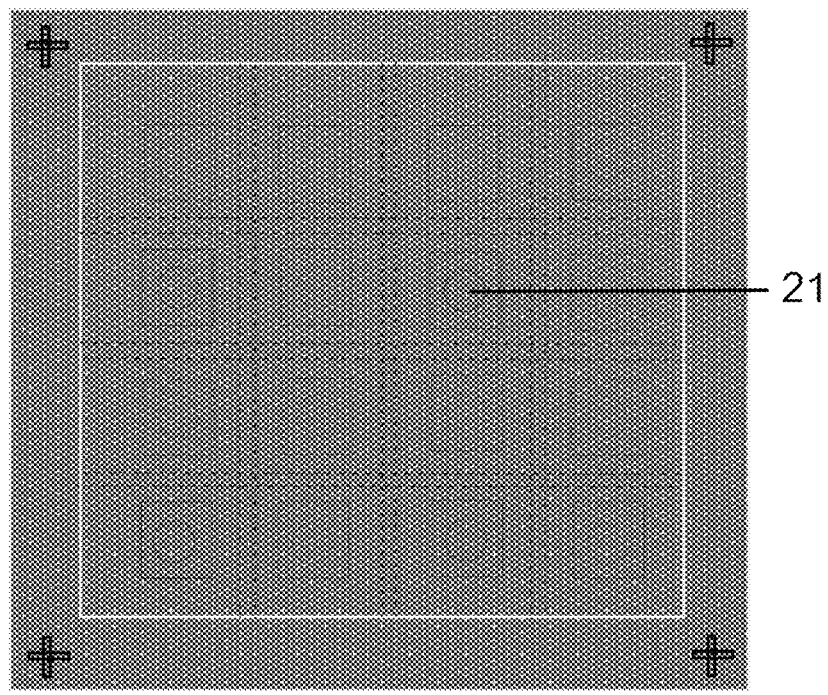
Figure 27:
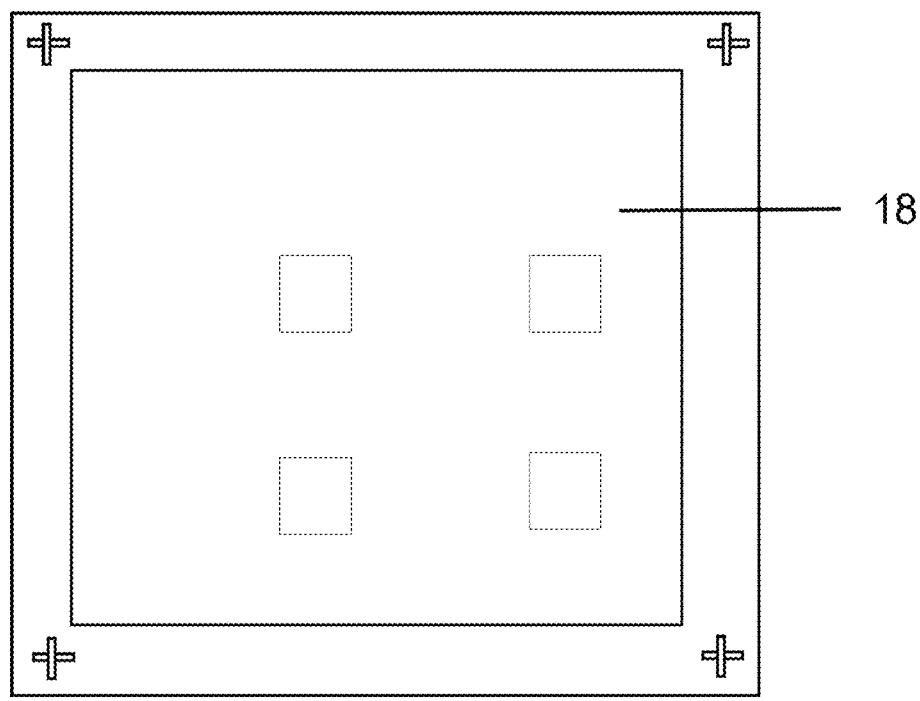
Figure 28:
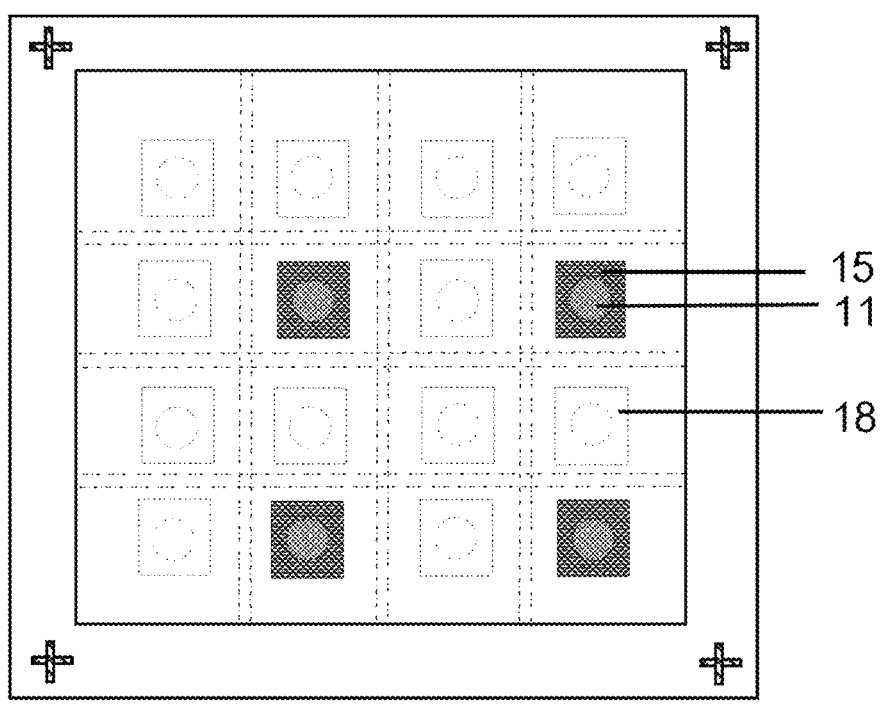
Figure 29:
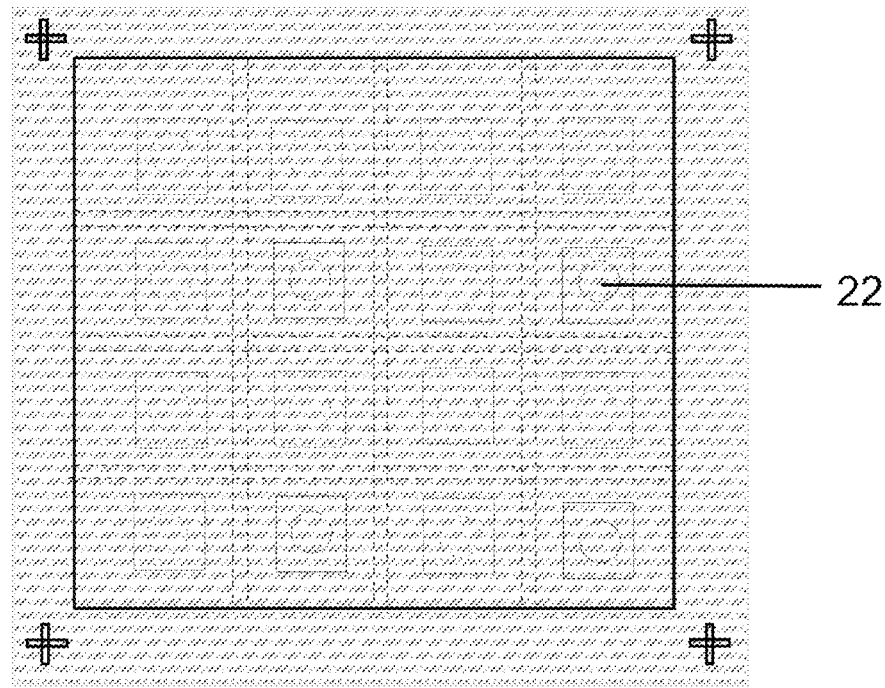

(2) A red light quantum dot, a green light quantum dot and a yellow light quantum dot of CdSe/ZnS with an II-VI core shell structure are dissolved in a methylbenzene solvent respectively. Then, the surface of the deep silicon etching template is spin-coated with a red light quantum dot solution 20. The quantum dots enter the micro-LED array device via square holes in the deep silicon etching template. The micro-LEDs spin-coated with the quantum dots and the deep silicon etching template are placed on a 60° C. drying table for drying. As shown in FIG. 23, the deep silicon etching template is removed; and on the micro-LED array device, only one of RGB pixel points is coated with the red light quantum dot.

Figure 33:
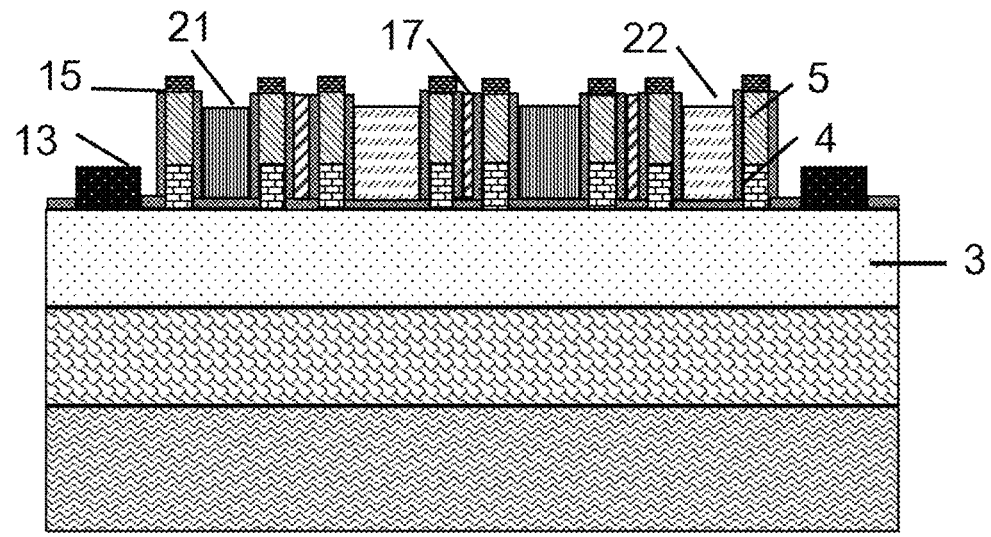
FIG. 33 is a schematic diagram showing a cross section of a micro panchromatic QLED array device based on a quantum dot transfer process of deep silicon etching templates according to the present invention.
Figure 34:
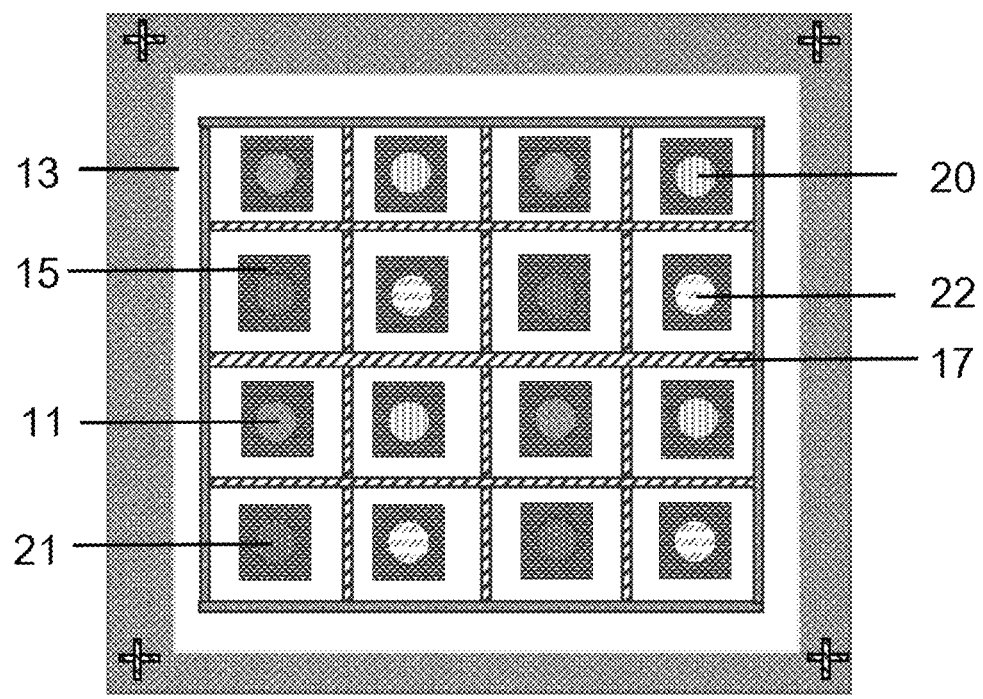
FIG. 34 is a schematic diagram showing a surface of a micro panchromatic QLED array device based on a quantum dot transfer process of deep silicon etching templates according to the present invention.

(3) According to the preparation method of the hole-shaped deep silicon etching template, the positions of square micro holes in the deep silicon etching template are changed. Two new deep silicon etching templates are prepared. Step (1) and step (2) are repeated twice. As shown in FIGS. 24-29, the micro holes of each RGB pixel unit are filled with a green light quantum dot solution 21 and a yellow light quantum dot solution 22, so that four-color display of each RGB pixel point is realized. A schematic diagram of a cross section of the device obtained is shown in FIG. 33. A schematic diagram of the surface is shown in FIG. 34.

Certainly, as for the present embodiment, filling sequences of the red light/green light/yellow light quantum dots can be randomly replaced, which will not bring any influence on quality and performance of the device.

As for the present embodiment, the "+"-shaped alignment marks can also be disposed at diagonal corners or any corner of the device and the silicon wafer.

Embodiment 2 A Micro Panchromatic QLED Array Device Based on a Quantum Dot Transfer Process of Deep Silicon Etching Templates In the present embodiment, an epitaxial wafer structure selected for a substrate material is shown in FIG. 1. A standard blue LED epitaxial wafer with a p-n structure includes a sapphire substrate 1; a GaN buffer layer 2 growing on the sapphire substrate; an n-type GaN layer 3 growing on the buffer layer; a quantum well active layer 4 growing on the n-type GaN layer; and a p-type GaN layer 5 growing on the quantum well active layer.

A specific preparation method for a micro-LED array device is as follows:

(1) As shown in FIG. 2, a plasma enhanced chemical vapor deposition (PECVD) technology is adopted to evaporate a 200 nm thick $SiO_2$ dielectric layer 6 on the $In_xGa_{1-x}N$/GaN quantum well blue LED epitaxial wafer. A growth mode of $SiO_2$ with the PECVD is as follows: a mixed gas of 5% $SiH_4/N_2$ and $N_2O$ is introduced into a reaction chamber, wherein flow rates are 100 sccm and 450 sccm, respectively. Under the conditions of pressure intensity of 300 mTorr, a power of 10 W and a temperature of 350° C., $SiO_2$ is deposited on the surface of the epitaxial wafer through a reaction of $SiH_x+O\rightarrow SiO_2$ (+$H_2$), wherein the duration is 9 minutes and 30 seconds.

(2) As shown in FIG. 3, the $SiO_2$ dielectric layer is spin-coated with a photoresist 7, and prebaking is carried out under 90° C. for the duration of 10 minutes; then, an ultraviolet lithography technology is adopted to transfer graphs on a photoetching plate to the photoresist, so that ordered square table array graphs, graphs of rectangular isolation slots which divide adjacent micro hole regions in square tables, and "+"-shaped alignment marks on four corners of each array between the adjacent square tables are formed; then development is carried out; and post-baking is carried out under 110° C. for 1 minute.

(3) A reactive ion etching (RIE) technology is adopted and $O_2$ is introduced at a gas flow rate of 10 sccm, pressure intensity of 3 Pa and a power of 50 W. A residual layer of the photoresist is removed within 20 seconds. Then, a physical vapor deposition (PVD) process is adopted to evaporate metal Ni of 30 nm thick as a mask 8 on the surface of a sample. As shown in FIG. 4, an evaporation rate is 0.5 A/s. Then, an acetone solution is adopted for ultrasonic treatment for 10 minutes to strip the photoresist layer 7 and the metal Ni film 8 on the photoresist layer. A large area of the ordered square table array graphs, the graphs of the rectangular isolation slots between the adjacent micro holes and "+"-shaped alignment marks between the adjacent tables are obtained. An interval between the adjacent tables is 90 μm; the width of the isolation slots is 16 μm; and the maximum length of the "+"-shaped alignment marks is 40 μm, and the maximum width of the "+"-shaped alignment marks is 20 μm as shown in FIG. 5.

(4) As shown in FIG. 6, the RIE technology is adopted to introduce a mixed gas of $CF_4$ and $O_2$ into the reaction chamber, wherein flow rates of the gases are $CF_4$: 30 sccm and $O_2$: 10 sccm; the power is 150 W; pressure intensity is 4 Pa; and the etching duration is 4 minutes. With metal Ni as the mask, longitudinal etching is carried out on the dielectric layer $SiO_2$. Metal square table structures, rectangular isolation slot structures between the adjacent micro holes and the "+"-shaped alignment marks between the adjacent square tables are transferred to the dielectric layer 6.

(5) As shown in FIG. 7, an inductivity coupled plasma (ICP) technology is adopted to introduce a mixed gas of $Cl_2$ and $BCl_3$ into the reaction chamber. With metal 8 and the dielectric layer 6 as the mask, anisotropic etching is carried out on the p-type GaN layer 5 and the quantum well layer 4 till the n-type GaN layer 3, so that a large area of the mutually isolated square table structures, the rectangular isolation slots between the adjacent micro holes and the "+"-shaped alignment marks between the adjacent square tables are formed. Etching conditions are as follows: $Cl_2$: 24 sccm; $BCl_3$: 3 sccm; the ICP power is 600 W; the RF power is 10 W; the pressure intensity is 6.5 mTorr; the duration is 9 minutes and 30 seconds; the etching depth is about 950 nm; and an interval between adjacent micro-LEDs formed is 90 μm.

(6) As shown in FIG. 8, wet etching is adopted to remove the metal mask layer 8 and the dielectric layer 6. Specifically, the sample is soaked in a nitric acid aqueous solution and a buffer oxide etchant (BOE) in succession, wherein one duration is 1 minute and the other duration is 40 seconds, respectively. The soaking process can also reduce etching damage on GaN and side walls of the quantum well.

(7) As shown in FIG. 9, the PECVD technology is adopted to evaporate a 200 nm thick $SiO_2$ dielectric layer 9 as a mask. A mixed gas of 5% $SiH_4/N_2$ and $N_2O$ is introduced into the reaction chamber, wherein flow rates are 100 sccm and 450 sccm, respectively, the pressure intensity is 300 mTorr, the power is 10 W, the temperature is 350° C., and the duration is 9 minutes and 30 seconds. A $SiO_2$ layer is deposited on the surface of the sample through a reaction of $SiH_x+O\rightarrow SiO_2$ (+$H_2$). Then the surface of the sample is spin-coated with a photoresist layer 10, and prebaking is carried out under 90° C. for 10 minutes. Then the ultraviolet lithography technology and a photoetching plate are adopted for overlaying on the photoresist to form a micro hole graph with the diameter of 50 μm and a cycle of 150 μm. Development is carried out. Post-baking is carried out under 110° C. for 1 minute. Then, as shown in FIG. 10, the RIE technology is adopted to introduce a mixed gas of $CF_4$ and $O_2$ into the reaction chamber, wherein flow rates of the gases are $CF_4$: 30 sccm and $O_2$: 10 sccm; the power is 150 W; the pressure intensity is 4 Pa; and the etching duration is 4 minutes. A photoresist 10 is used as a mask for longitudinal etching of the dielectric layer $SiO_2$ 6. As shown in FIG. 11, the ICP technology is adopted to introduce a mixed gas of $Cl_2$ and $BCl_3$ into the reaction chamber. The photoresist 10 and the dielectric layer 9 are taken as masks for anisotropic etching of the p-type GaN layer 5. Etching conditions are as follows: $Cl_2$: 24 sccm; $BCl_3$: 3 sccm; the ICP power is 600 W; the RF power is 10 W; the pressure intensity is 6.5 mTorr; the duration is 9 minutes; and the etching depth is about 900 nm. A micro hole array with the diameter of 50 μm, a cycle of 150 μm and a depth of 900 nm is obtained.

(8) As shown in FIG. 12, wet etching is used. The sample is soaked in the BOE for 1 minute. The $SiO_2$ dielectric layer 9 and a residual photoresist layer 10 on the dielectric layer are removed. In addition, etching damage on GaN and the surface and side walls of the quantum well is reduced.

(9) As shown in FIG. 13, the PECVD technology is adopted to evaporate a 200 nm thick $SiO_2$ dielectric layer 11 on the surface of the sample. A mixed gas of 5% $SiH_4/N_2$ and $N_2O$ is introduced into the reaction chamber, wherein flow rates are 100 sccm and 450 sccm, respectively, the pressure intensity is 300 mTorr, the power is 10 W, the temperature is 350° C., and the duration is 9 minutes and 30 seconds. A $SiO_2$ layer is deposited on the surface of the sample through a reaction of $SiH_x+O \rightarrow SiO_2 (+H_2)$.

(10) An n-type electrode is prepared. The surface of the sample is spin-coated with a photoresist layer 12, and prebaking is carried out under 90° C. for 10 minutes. The ultraviolet lithography technology is adopted to overlay an n-type electrode graph on the photoetching plate to the photoresist. Development is carried out. Post-baking under 110° C. is carried out for 1 minute. Then, as shown in FIG. 14, the RIE technology is adopted to introduce a mixed gas of $CF_4$ and $O_2$ into the reaction chamber, wherein flow rates of the gases are $CF_4$: 30 sccm and $O_2$: 10 sccm; the power is 150 W; the pressure intensity is 4 Pa; and the etching duration is 4 minutes. The photoresist 12 is taken as a mask for etching a $SiO_2$ dielectric layer film 11. The n-type electrode graph is transferred to n-type GaN 3. The PVD process is adopted to successively evaporate four metals of Ti, Al, Ni and Au on the surface of the sample, with thicknesses of 50 nm, 100 nm, 50 nm and 150 nm respectively, and a product is taken as an n-type electrode 13. Then, as shown in FIG. 15, an acetone ultrasonic technology is adopted to strip the photoresist 12 and the metal film 13 on the photoresist layer. The sample is cleaned and dried. In the end, thermal annealing is carried out under $N_2$, a temperature of 750° C. and a duration of 30 seconds. In this way, ohmic contact between the metal Ti/Al/Ni/Au and the n-type GaN is realized.

(11) A p-type electrode is prepared. As shown in FIG. 16, the surface of the sample is spin-coated with a photoresist layer 14, and prebaking is carried out under 90° C. for 10 minutes. The ultraviolet lithography technology is adopted to overlay a p-type electrode graph on the photoetching plate to the photoresist. Development is carried out. Post-baking under 110° C. is carried out for 1 minute. The RIE technology is adopted to introduce a mixed gas of $CF_4$ and $O_2$ into the reaction chamber, wherein flow rates of the gases are $CF_4$: 30 sccm and $O_2$: 10 sccm; the power is 150 W; the pressure intensity is 4 Pa; and the etching duration is 4 minutes. The photoresist 14 is taken as a mask for etching a $SiO_2$ dielectric layer film 9. The p-type electrode graph is transferred to p-type GaN 3. The PVD process is adopted to successively evaporate two metals of Ni and Au on the surface of the sample, with thicknesses of 150 nm and 300 nm respectively, and a product is taken as a p-type electrode 15. An acetone ultrasonic technology is adopted to strip the photoresist 14 and the metal film 15 on the photoresist layer. The sample is cleaned and dried. In the end, thermal annealing is carried out under $N_2$, a temperature of 750° C. and a duration of 30 seconds. In this way, ohmic contact between the metal Ni/Au and the p-type GaN is realized, as shown in FIG. 17.

(12) The isolation slots are filled with light absorption materials. As shown in FIG. 18, the surface of the sample is spin-coated with a photoresist layer 16 again, and prebaking is carried out under 90° C. for 10 minutes. The ultraviolet lithography technology and the photoetching plate are adopted for overlaying on the photoresist to form graphs of the rectangular isolation slots. Development is carried out. Post-baking under 110° C. is carried out for 1 minute; the surface of the sample is spin-coated with a layer of light absorption material Vantablack 17, and the light absorption material enters the isolation slots in regions without the photoresist; then, through wet etching, the sample is soaked in the BOE for 1 minute, and the photoresist 16 and the light absorption material 17 thereon are removed. The sample is cleaned and dried, as shown in FIG. 19.

A preparation method for a hole-shaped deep silicon etching template in a quantum dot transfer process of deep silicon etching templates includes the following steps:

(1) A deep silicon etching template is prepared. The surface of a cleaned 400 μm thick silicon wafer 18 is spin-coated with an AZ4620 positive photoresist 19, and prebaking is carried out under 95° C. for 4 minutes. Then, an ultraviolet lithography technology is adopted to transfer graphs of periodical square holes in the surface of a photoetching plate and "+"-shaped alignment marks on four corners of each array to the surface of the silicon wafer. Development is carried out. Post-baking under 110° C. is carried out for 5 minutes. The edge length of the square holes is 134 μm. The rectangular "+"-shaped alignment marks are 40 μm long and 20 μm wide, as shown in FIG. 20.

(2) The photoresist is taken as a mask. A deep silicon etching technology is adopted. Gases $C_4F_8$ and $SF_6$ are introduced into a reaction chamber for etching for 57 minutes and 12 seconds. The silicon wafer is etched through. Hollow square hole-shaped structures and "+"-shaped alignment marks are formed on the surface of the silicon wafer, as shown in FIG. 21.

A quantum dot transfer process of deep silicon etching templates includes the following steps:

(1) A deep silicon etching template is placed above micro-LEDs. A "+"-shaped alignment mark on a silicon wafer and a "+"-shaped photoetching alignment mark on a micro-LED array are aligned under a microscope, as shown in FIG. 22.

(2) A red light quantum dot, a green light quantum dot and a yellow light quantum dot of CdSe/ZnS with an II-VI core shell structure are dissolved in a methylbenzene solvent respectively. Then, the surface of the deep silicon etching template is spin-coated with a red light quantum dot solution 20. The quantum dots enter the micro-LED array device via square holes in the deep silicon etching template. The micro-LEDs spin-coated with the quantum dots and the deep silicon etching template are placed on a 60° C. drying table for drying. As shown in FIG. 23, the deep silicon etching template is removed; and on the micro-LED array device, only one of RGB pixel points is coated with the red light quantum dot.

(3) According to the preparation method of the hole-shaped deep silicon etching template, the positions of square micro holes in the deep silicon etching template are changed.

Two new deep silicon etching templates are prepared. Step (1) and step (2) are repeated twice. As shown in FIGS. 24-29, the micro holes of each RGB pixel unit are filled with a green light quantum dot solution 21 and a yellow light quantum dot solution 22, so that four-color display of each RGB pixel point is realized. A schematic diagram of a cross section of the device obtained is shown in FIG. 33. A schematic diagram of the surface is shown in FIG. 34.

Certainly, as for the present embodiment, filling sequences of the red light/green light/yellow light quantum dots can be randomly replaced, which will not bring any influence on quality and performance of the device.

As for the present embodiment, the "+"-shaped alignment marks can also be disposed at diagonal corners or any corner of the device and the silicon wafer.

Embodiment 3 A Micro Panchromatic QLED Array Device Based on a Quantum Dot Transfer Process of Deep Silicon Etching Templates In the present embodiment, an epitaxial wafer structure selected for a substrate material is shown in FIG. 1. A standard blue LED epitaxial wafer with a p-n structure includes a sapphire substrate 1; a GaN buffer layer 2 growing on the sapphire substrate; an n-type GaN layer 3 growing on the buffer layer; a quantum well active layer 4 growing on the n-type GaN layer; and a p-type GaN layer 5 growing on the quantum well active layer.

A specific preparation method for a micro-LED array device is as follows:

(1) As shown in FIG. 2, a plasma enhanced chemical vapor deposition (PECVD) technology is adopted to evaporate a 250 nm thick $SiO_2$ dielectric layer 6 on the $In_xGa_{1-x}N$/GaN quantum well blue LED epitaxial wafer. A growth mode of $SiO_2$ with the PECVD is as follows: a mixed gas of 5% $SiH_4/N_2$ and $N_2O$ is introduced into a reaction chamber, wherein flow rates are 100 sccm and 450 sccm, respectively. Under the conditions of pressure intensity of 300 mTorr, a power of 10 W and a temperature of 350° C., $SiO_2$ is deposited on the surface of the epitaxial wafer through a reaction of $SiH_x+O \rightarrow SiO_2$ $(+H_2)$ for the duration of 11 minutes and 50 seconds.

(2) As shown in FIG. 3, the $SiO_2$ dielectric layer is spin-coated with a photoresist 7, and prebaking is carried out under 90° C. for the duration of 10 minutes; then, an ultraviolet lithography technology is adopted to transfer graphs on a photoetching plate to the photoresist, so that ordered square table array graphs, graphs of rectangular isolation slots which divide adjacent micro hole regions in square tables, and "+"-shaped alignment marks on diagonal corners of each array between the adjacent square tables are formed; then development is carried out; and post-baking is carried out under 110° C. for 1 minute.

(3) A reactive ion etching (RIE) technology is adopted and $O_2$ is introduced at a gas flow rate of 10 sccm, pressure intensity of 3 Pa and a power of 50 W. A residual layer of the photoresist is removed within 20 seconds. Then, a physical vapor deposition (PVD) process is adopted to evaporate metal Ni of 100 nm thick as a mask 8 on the surface of a sample. As shown in FIG. 4, an evaporation rate is 0.5 A/s. Then, an acetone solution is adopted for ultrasonic treatment for 10 minutes to strip the photoresist layer 7 and the metal Ni film 8 on the photoresist layer. A large area of the ordered square table array graphs, the graphs of the rectangular isolation slots between the adjacent micro holes and "+"-shaped alignment marks between the adjacent tables are obtained. An interval between the adjacent tables is 100 μm; the width of the isolation slots is 20 μm; and the maximum length of the "+"-shaped alignment marks is 40 μm, and the maximum width of the "+"-shaped alignment marks is 20 μm as shown in FIG. 5.

(4) As shown in FIG. 6, the RIE technology is adopted to introduce a mixed gas of $CF_4$ and $O_2$ into the reaction chamber, wherein flow rates of the gases are $CF_4$: 30 sccm and $O_2$: 10 sccm; the power is 150 W; pressure intensity is 4 Pa; and the etching duration is 5 minutes. With metal Ni as the mask, longitudinal etching is carried out on the dielectric layer $SiO_2$. Metal square table structures, rectangular isolation slot structures between the adjacent micro holes and the "+"-shaped alignment marks between the adjacent square tables are transferred to the dielectric layer 6.

(5) As shown in FIG. 7, an inductivity coupled plasma (ICP) technology is adopted to introduce a mixed gas of $Cl_2$ and $BCl_3$ into the reaction chamber. With metal 8 and the dielectric layer 6 as the mask, anisotropic etching is carried out on the p-type GaN layer 5 and the quantum well layer 4 till the n-type GaN layer 3, so that a large area of the mutually isolated square table structures, the rectangular isolation slots between the adjacent micro holes and the "+"-shaped alignment marks between the adjacent square tables are formed. Etching conditions are as follows: $Cl_2$: 24 sccm; $BCl_3$: 3 sccm; the ICP power is 600 W; the RF power is 10 W; the pressure intensity is 6.5 mTorr; the duration is 9 minutes and 30 seconds; the etching depth is about 950 nm; and an interval between the adjacent micro-LEDs formed is 100 μm.

(6) As shown in FIG. 8, wet etching is adopted to remove the metal mask layer 8 and the dielectric layer 6. Specifically, the sample is soaked in a nitric acid aqueous solution and a buffer oxide etchant (BOE) in succession, wherein one duration is 1 minute and the other duration is 40 seconds, respectively. The soaking process can also reduce etching damage on GaN and side walls of the quantum well.

(7) As shown in FIG. 9, the PECVD technology is adopted to evaporate a 250 nm thick $SiO_2$ dielectric layer 9 as a mask. A mixed gas of 5% $SiH_4/N_2$ and $N_2O$ is introduced into the reaction chamber, wherein flow rates are 100 sccm and 450 sccm, respectively, the pressure intensity is 300 mTorr, the power is 10 W, the temperature is 350° C., and the duration is 11 minutes and 50 seconds. A $SiO_2$ layer is deposited on the surface of the sample through a reaction of $SiH_x+O \rightarrow SiO_2$ $(+H_2)$. Then the surface of the sample is spin-coated with a photoresist layer 10, and prebaking is carried out under 90° C. for 10 minutes. Then the ultraviolet lithography technology and a photoetching plate are adopted for overlaying on the photoresist to form a micro hole graph with the diameter of 100 μm and a cycle of 200 μm. Development is carried out. Post-baking is carried out under 110° C. for 1 minute. Then, as shown in FIG. 10, the RIE technology is adopted to introduce a mixed gas of $CF_4$ and $O_2$ into the reaction chamber, wherein flow rates of the gases are $CF_4$: 30 sccm and $O_2$: 10 sccm; the power is 150 W; the pressure intensity is 4 Pa; and the etching duration is 5 minutes. A photoresist 10 is used as a mask for longitudinal etching of the dielectric layer $SiO_2$ 6. As shown in FIG. 11, the ICP technology is adopted to introduce a mixed gas of $Cl_2$ and $BCl_3$ into the reaction chamber. The photoresist 10 and the dielectric layer 9 are taken as masks for anisotropic etching of the p-type GaN layer 5. Etching conditions are as follows: $Cl_2$: 24 sccm; $BCl_3$: 3 sccm; the ICP power is 600 W; the RF power is 10 W; the pressure intensity is 6.5 mTorr; the duration is 10 minutes and 20 seconds; and the etching depth is about 1.2 μm. A micro hole array with the diameter of 100 μm, a cycle of 200 μm and a depth of 1.2 μm is obtained.

(8) As shown in FIG. 12, wet etching is used. The sample is soaked in the BOE for 1 minute. The SiO$_2$ dielectric layer 9 and a residual photoresist layer 10 on the dielectric layer are removed. In addition, etching damage on GaN and the surface and side walls of the quantum well is reduced.

(9) As shown in FIG. 13, the PECVD technology is adopted to evaporate a 250 nm thick SiO$_2$ dielectric layer 11 on the surface of the sample. A mixed gas of 5% SiH$_4$/N$_2$ and N$_2$O is introduced into the reaction chamber, wherein flow rates are 100 sccm and 450 sccm, respectively, the pressure intensity is 300 mTorr, the power is 10 W, the temperature is 350° C., and the duration is 11 minutes and 50 seconds. A SiO$_2$ layer is deposited on the surface of the sample through a reaction of SiH$_x$+O→SiO$_2$ (+H$_2$).

(10) An n-type electrode is prepared. The surface of the sample is spin-coated with a photoresist layer 12, and prebaking is carried out under 90° C. for 10 minutes. The ultraviolet lithography technology is adopted to overlay an n-type electrode graph on the photoetching plate to the photoresist. Development is carried out. Post-baking under 110° C. is carried out for 1 minute. Then, as shown in FIG. 14, the RIE technology is adopted to introduce a mixed gas of CF$_4$ and O$_2$ into the reaction chamber, wherein flow rates of the gases are CF$_4$: 30 sccm and O$_2$: 10 sccm; the power is 150 W; the pressure intensity is 4 Pa; and the etching duration is 5 minutes. The photoresist 12 is taken as a mask for etching a SiO$_2$ dielectric layer film 11. The n-type electrode graph is transferred to n-type GaN 3. The PVD process is adopted to successively evaporate four metals of Ti, Al, Ni and Au on the surface of the sample, with thicknesses of 100 nm, 150 nm, 200 nm and 400 nm respectively, and a product is taken as an n-type electrode 13. Then, as shown in FIG. 15, an acetone ultrasonic technology is adopted to strip the photoresist 12 and the metal film 13 on the photoresist layer. The sample is cleaned and dried. In the end, thermal annealing is carried out under N$_2$, a temperature of 750° C. and a duration of 30 seconds. In this way, ohmic contact between the metal Ti/Al/Ni/Au and the n-type GaN is realized.

(11) A p-type electrode is prepared. As shown in FIG. 16, the surface of the sample is spin-coated with a photoresist layer 14, and prebaking is carried out under 90° C. for 10 minutes. The ultraviolet lithography technology is adopted to overlay a p-type electrode graph on the photoetching plate to the photoresist. Development is carried out. Post-baking under 110° C. is carried out for 1 minute. The RIE technology is adopted to introduce a mixed gas of CF$_4$ and O$_2$ into the reaction chamber, wherein flow rates of the gases are CF$_4$: 30 sccm and O$_2$: 10 sccm; the power is 150 W; the pressure intensity is 4 Pa; and the etching duration is 5 minutes. The photoresist 14 is taken as a mask for etching a SiO$_2$ dielectric layer film 9. The p-type electrode graph is transferred to p-type GaN 3. The PVD process is adopted to successively evaporate two metals of Ni and Au on the surface of the sample, with thicknesses of 200 nm and 300 nm respectively, and a product is taken as a p-type electrode 15. An acetone ultrasonic technology is adopted to strip the photoresist 14 and the metal film 15 on the photoresist layer. The sample is cleaned and dried. In the end, thermal annealing is carried out under N$_2$, a temperature of 750° C. and a duration of 30 seconds. In this way, ohmic contact between the metal Ni/Au and the p-type GaN is realized, as shown in FIG. 17.

(12) The isolation slots are filled with light absorption materials. As shown in FIG. 18, the surface of the sample is spin-coated with a photoresist layer 16 again, and prebaking is carried out under 90° C. for 10 minutes. The ultraviolet lithography technology and the photoetching plate are adopted for overlaying on the photoresist to form graphs of the rectangular isolation slots. Development is carried out. Post-baking under 110° C. is carried out for 1 minute; the surface of the sample is spin-coated with a layer of light absorption material Vantablack 17, and the light absorption material enters the isolation slots in regions without the photoresist; then, through wet etching, the sample is soaked in the BOE for 1 minute, and the photoresist 16 and the light absorption material 17 thereon are removed. The sample is cleaned and dried, as shown in FIG. 19.

A preparation method for a hole-shaped deep silicon etching template in a quantum dot transfer process of deep silicon etching templates includes the following steps:

(1) A deep silicon etching template is prepared. The surface of a cleaned 500 μm thick silicon wafer 18 is spin-coated with an AZ4620 positive photoresist 19, and prebaking is carried out under 95° C. for 4 minutes. Then, an ultraviolet lithography technology is adopted to transfer graphs of periodical square holes in the surface of a photoetching plate and "+"-shaped alignment marks on diagonal corners of each array to the surface of the silicon wafer. Development is carried out. Post-baking under 110° C. is carried out for 5 minutes. The edge length of the square holes is 180 μm. The rectangular "+"-shaped alignment marks are 40 μm long and 20 μm wide, as shown in FIG. 20.

Figure 30:
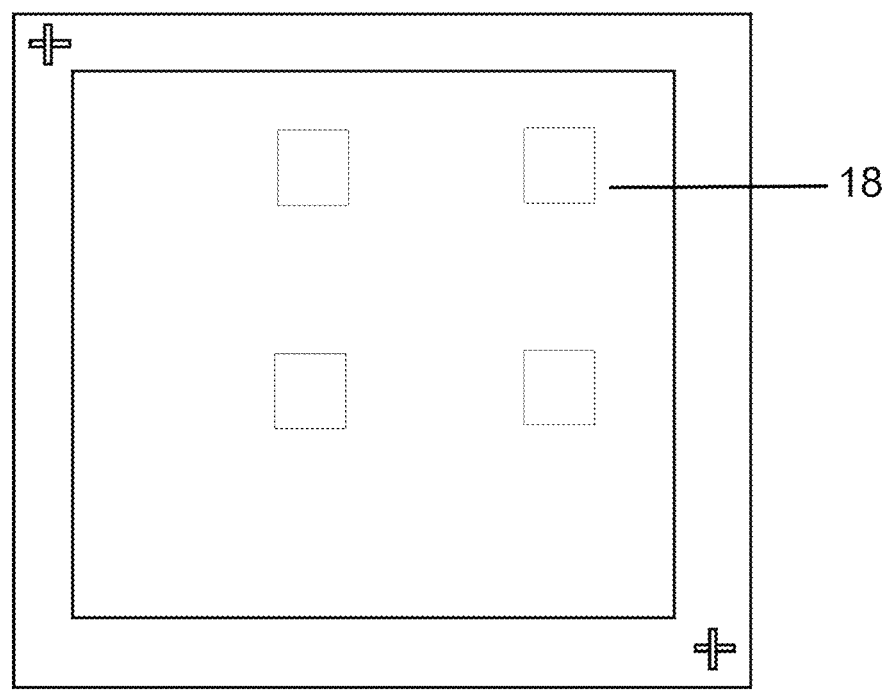
FIG. 30 is a schematic structural diagram showing a surface of a hole-shaped silicon wafer mask plate with diagonal corners having "+"-shaped marks, obtained by step (2) of a preparation method for hole-shaped deep silicon etching templates in a quantum dot transfer process of deep silicon etching templates according to the present invention.

(2) The photoresist is taken as a mask. A deep silicon etching technology is adopted. Gases C$_4$F$_8$ and SF$_6$ are introduced into a reaction chamber for etching for 95 minutes and 20 seconds. The silicon wafer is etched through. Hollow square hole-shaped structures and "+"-shaped alignment marks are formed on the surface of the silicon wafer, as shown in FIG. 30.

Figure 31:
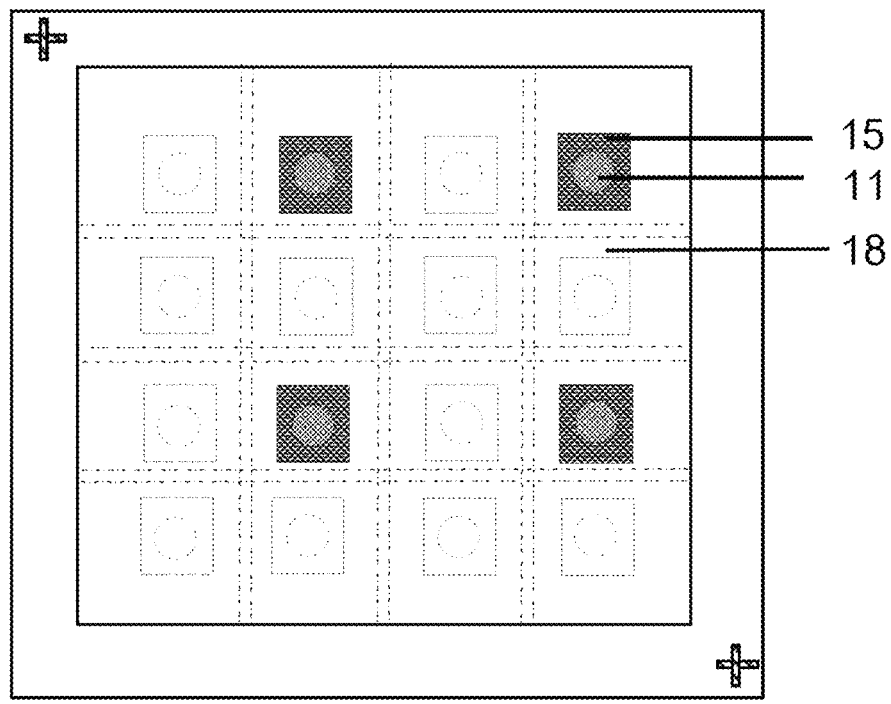
FIG. 31 is a schematic diagram showing alignment of a hole-shaped deep silicon etching template with diagonal corners having "+"-shaped marks, obtained by step (1) of a quantum dot transfer process of deep silicon etching templates, and a micro-LED array device, according to the present invention.

A quantum dot transfer process of deep silicon etching templates includes the following steps:

(1) A deep silicon etching template is placed above micro-LEDs. A "+"-shaped alignment mark on a silicon wafer and a "+"-shaped photoetching alignment mark on a micro-LED array are aligned under a microscope, as shown in FIG. 31.

Figure 32:
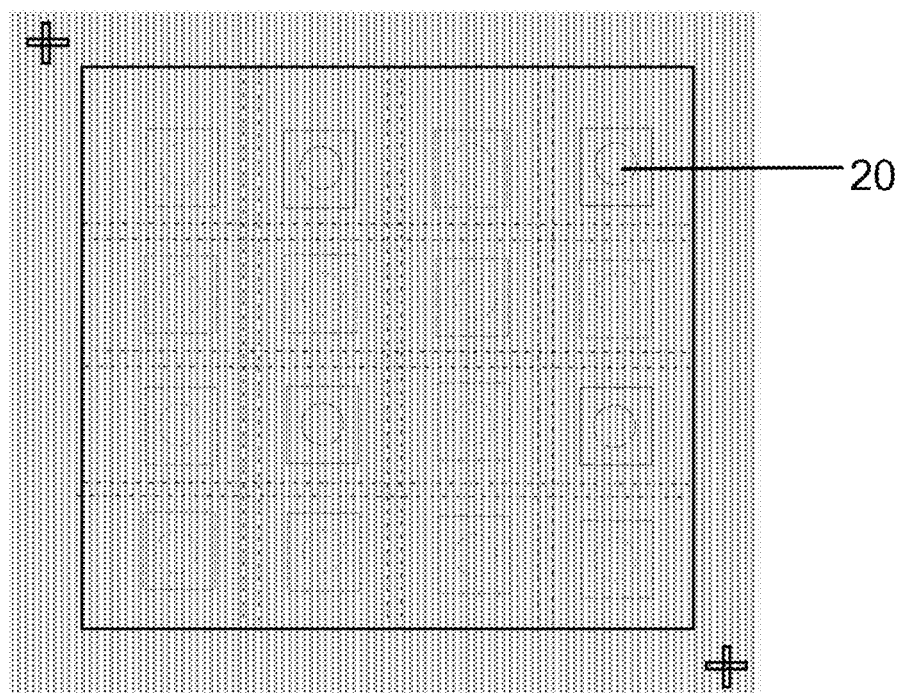
FIG. 32 is a schematic diagram showing a surface of a micro-LED array device obtained through spin-coating of a red light quantum dot on a hole-shaped deep silicon etching template with diagonal corners having "+"-shaped marks, obtained by step (2) of a quantum dot transfer process of deep silicon etching templates according to the present invention.

(2) A red light quantum dot, a green light quantum dot and a yellow light quantum dot of CdSe/ZnS with an II-VI core shell structure are dissolved in a methylbenzene solvent respectively. Then, the surface of the deep silicon etching template is spin-coated with a red light quantum dot solution 20. The quantum dots enter the micro-LED array device via square holes in the deep silicon etching template. The micro-LEDs spin-coated with the quantum dots and the deep silicon etching template are placed on a 60° C. drying table for drying. As shown in FIG. 32, the deep silicon etching template is removed; and on the micro-LED array device, only one of RGB pixel points is coated with the red light quantum dot.

(3) According to the preparation method of the hole-shaped deep silicon etching template, the positions of the square micro holes in the deep silicon etching template are changed. Two new deep silicon etching templates are prepared. Step (1) and step (2) are repeated twice. The micro holes of each RGB pixel unit are filled with a green light quantum dot solution 21 and a yellow light quantum dot solution 22, so that four-color display of each RGB pixel point is realized. A schematic diagram of a cross section of the device obtained is shown in FIG. 33. A schematic diagram of the surface is shown in FIG. 34.

Certainly, as for the present embodiment, filling sequences of the red light/green light/yellow light quantum dots can be randomly replaced, which will not bring any influence on quality and performance of the device.

As for the present embodiment, the "+"-shaped alignment marks can also be disposed at four corners or any corner of the device and the silicon wafer.

Embodiment 4 A Micro Panchromatic QLED Array Device Based on a Quantum Dot Transfer Process of Deep Silicon Etching Templates In the present embodiment, an epitaxial wafer structure selected for a substrate material is a standard violet LED epitaxial wafer with a p-n structure, which includes a sapphire substrate 1; a GaN buffer layer 2 growing on the sapphire substrate; an n-type GaN layer 3 growing on the buffer layer; a quantum well active layer 4 growing on the n-type GaN layer; and a p-type GaN layer 5 growing on the quantum well active layer.

A specific preparation method for a micro-LED array device is as follows:

(1) A plasma enhanced chemical vapor deposition (PECVD) technology is adopted to evaporate a 250 nm thick $SiO_2$ dielectric layer 6 on a $In_xGa_{1-x}N$/GaN quantum well blue LED epitaxial wafer. A growth mode of $SiO_2$ with the PECVD is as follows: a mixed gas of 5% $SiH_4/N_2$ and $N_2O$ is introduced into a reaction chamber, wherein flow rates are 100 sccm and 450 sccm, respectively. Under the conditions of pressure intensity of 300 mTorr, a power of 10 W and a temperature of 350° C., $SiO_2$ is deposited on the surface of the epitaxial wafer through a reaction of $SiH_x+O \rightarrow SiO_2$ $(+H_2)$ for the duration of 11 minutes and 50 seconds.

(2) The $SiO_2$ dielectric layer is spin-coated with a photoresist 7, and prebaking is carried out under 90° C. for the duration of 10 minutes; then, an ultraviolet lithography technology is adopted to transfer graphs on a photoetching plate to the photoresist, so that ordered square table array graphs, graphs of rectangular isolation slots which divide adjacent micro hole regions in square tables, and "+"-shaped alignment marks on diagonal corners of each array between the adjacent square tables are formed; then development is carried out; and post-baking is carried out under 110° C. for 1 minute.

(3) A reactive ion etching (RIE) technology is adopted and $O_2$ is introduced at a gas flow rate of 10 sccm, pressure intensity of 3 Pa and a power of 50 W. A residual layer of the photoresist is removed within 20 seconds. Then, a physical vapor deposition (PVD) process is adopted to evaporate metal Ni of 50 nm thick as a mask 8 on the surface of a sample. An evaporation rate is 0.5 A/s. Then, an acetone solution is adopted for ultrasonic treatment for 10 minutes to strip the photoresist layer 7 and the metal Ni film 8 on the photoresist layer. A large area of the ordered square table array graphs, the graphs of the rectangular isolation slots between the adjacent micro holes and "+"-shaped alignment marks between the adjacent tables are obtained. An interval between the adjacent tables is 100 μm; the width of the isolation slots is 20 μm; and the maximum length of the "+"-shaped alignment marks is 40 μm, and the maximum width of the "+"-shaped alignment marks is 20 μm.

(4) The RIE technology is adopted to introduce a mixed gas of $CF_4$ and $O_2$ into the reaction chamber, wherein flow rates of the gases are $CF_4$: 30 sccm and $O_2$: 10 sccm; the power is 150 W; pressure intensity is 4 Pa; and the etching duration is 5 minutes. With metal Ni as the mask, longitudinal etching is carried out on the dielectric layer $SiO_2$. Metal square table structures, rectangular isolation slot structures between the adjacent micro holes and the "+"-shaped alignment marks between the adjacent square tables are transferred to the dielectric layer 6.

(5) An inductivity coupled plasma (ICP) technology is adopted to introduce a mixed gas of $Cl_2$ and $BCl_3$ into the reaction chamber. With metal 8 and the dielectric layer 6 as the mask, anisotropic etching is carried out on the p-type GaN layer 5 and the quantum well layer 4 till the n-type GaN layer 3, so that a large area of the mutually isolated square table structures, the rectangular isolation slots between the adjacent micro holes and the "+"-shaped alignment marks between the adjacent square tables are formed. Etching conditions are as follows: $Cl_2$: 24 sccm; $BCl_3$: 3 sccm; the ICP power is 600 W; the RF power is 10 W; the pressure intensity is 6.5 mTorr; the duration is 9 minutes and 30 seconds; the etching depth is about 950 nm; and an interval between adjacent micro-LEDs formed is 100 μm.

(6) Wet etching is adopted to remove the metal mask layer 8 and the dielectric layer 6. Specifically, the sample is soaked in a nitric acid aqueous solution and a buffer oxide etchant (BOE) in succession, wherein one duration is 1 minute and the other duration is 40 seconds, respectively. The soaking process can also reduce etching damage on GaN and side walls of the quantum well.

(7) The PECVD technology is adopted to evaporate a 250 nm thick $SiO_2$ dielectric layer 9 as a mask. A mixed gas of 5% $SiH_4/N_2$ and $N_2O$ is introduced into the reaction chamber, wherein flow rates are 100 sccm and 450 sccm, respectively, the pressure intensity is 300 mTorr, the power is 10 W, the temperature is 350° C., and the duration is 11 minutes and 50 seconds. A $SiO_2$ layer is deposited on the surface of the sample through a reaction of $SiH_x+O \rightarrow SiO_2$ $(+H_2)$. Then the surface of the sample is spin-coated with a photoresist layer 10, and prebaking is carried out under 90° C. for 10 minutes. Then the ultraviolet lithography technology and a photoetching plate are adopted for overlaying on the photoresist to form a micro hole graph with the diameter of 100 and a cycle of 200 μm. Development is carried out. Post-baking is carried out under 110° C. for 1 minute. Then, the RIE technology is adopted to introduce a mixed gas of $CF_4$ and $O_2$ into the reaction chamber, wherein flow rates of the gases are $CF_4$: 30 sccm and $O_2$: 10 sccm; the power is 150 W; the pressure intensity is 4 Pa; and the etching duration is 5 minutes. A photoresist 10 is used as a mask for longitudinal etching of the dielectric layer $SiO_2$ 6. The ICP technology is adopted to introduce a mixed gas of $Cl_2$ and $BCl_3$ into the reaction chamber. The photoresist 10 and the dielectric layer 9 are taken as masks for anisotropic etching of the p-type GaN layer 5. Etching conditions are as follows: $Cl_2$: 24 sccm; $BCl_3$: 3 sccm; the ICP power is 600 W; the RF power is 10 W; the pressure intensity is 6.5 mTorr; the duration is 15 minutes; and the etching depth is about 1.5 μm. A micro hole array with the diameter of 100 μm, a cycle of 200 μm and a depth of 1.5 μm is obtained.

(8) Wet etching is used. The sample is soaked in the BOE for 1 minute. The $SiO_2$ dielectric layer 9 and a residual photoresist layer 10 on the dielectric layer are removed. In addition, etching damage on GaN and the surface and side walls of the quantum well is reduced.

(9) The PECVD technology is adopted to evaporate a 250 nm thick $SiO_2$ dielectric layer 11 on the surface of the sample. A mixed gas of 5% $SiH_4/N_2$ and $N_2O$ is introduced into the reaction chamber, wherein flow rates are 100 sccm and 450 sccm, respectively, the pressure intensity is 300 mTorr, the power is 10 W, the temperature is 350° C., and the duration is 11 minutes and 50 seconds. A SiO$_2$ layer is deposited on the surface of the sample through a reaction of SiH$_x$+O→SiO$_2$ (+H$_2$).

(10) An n-type electrode is prepared. The surface of the sample is spin-coated with a photoresist layer 12, and prebaking is carried out under 90° C. for 10 minutes. The ultraviolet lithography technology is adopted to overlay an n-type electrode graph on the photoetching plate to the photoresist. Development is carried out. Post-baking under 110° C. is carried out for 1 minute. Then, the RIE technology is adopted to introduce a mixed gas of CF$_4$ and O$_2$ into the reaction chamber, wherein flow rates of the gases are CF$_4$: 30 sccm and O$_2$: 10 sccm; the power is 150 W; the pressure intensity is 4 Pa; and the etching duration is 5 minutes. The photoresist 12 is taken as a mask for etching a SiO$_2$ dielectric layer film 11. The n-type electrode graph is transferred to n-type GaN 3. The PVD process is adopted to successively evaporate four metals of Ti, Al, Ni and Au on the surface of the sample, with thicknesses of 100 nm, 150 nm, 200 nm and 400 nm respectively, and a product is taken as an n-type electrode 13. Then, an acetone ultrasonic technology is adopted to strip the photoresist 12 and the metal film 13 on the photoresist layer. The sample is cleaned and dried. In the end, thermal annealing is carried out under N$_2$, a temperature of 750° C. and a duration of 30 seconds. In this way, ohmic contact between the metal Ti/Al/Ni/Au and the n-type GaN is realized.

(11) A p-type electrode is prepared. The surface of the sample is spin-coated with a photoresist layer 14, and prebaking is carried out under 90° C. for 10 minutes. The ultraviolet lithography technology is adopted to overlay a p-type electrode graph on the photoetching plate to the photoresist. Development is carried out. Post-baking under 110° C. is carried out for 1 minute. The RIE technology is adopted to introduce a mixed gas of CF$_4$ and O$_2$ into the reaction chamber, wherein flow rates of the gases are CF$_4$: 30 sccm and O$_2$: 10 sccm; the power is 150 W; the pressure intensity is 4 Pa; and the etching duration is 5 minutes. The photoresist 14 is taken as a mask for etching a SiO$_2$ dielectric layer film 9. The p-type electrode graph is transferred to p-type GaN 3. The PVD process is adopted to successively evaporate two metals of Ni and Au on the surface of the sample, with thicknesses of 250 nm and 300 nm respectively, and a product is taken as a p-type electrode 15. An acetone ultrasonic technology is adopted to strip the photoresist 14 and the metal film 15 on the photoresist layer. The sample is cleaned and dried. In the end, thermal annealing is carried out under Na, a temperature of 750° C. and a duration of 30 seconds. In this way, ohmic contact between the metal Ni/Au and the p-type GaN is realized.

(12) The isolation slots are filled with light absorption materials. The surface of the sample is spin-coated with a photoresist layer 16 again, and prebaking is carried out under 90° C. for 10 minutes. The ultraviolet lithography technology and the photoetching plate are adopted for overlaying on the photoresist to form graphs of the rectangular isolation slots. Development is carried out. Post-baking under 110° C. is carried out for 1 minute; the surface of the sample is spin-coated with a layer of light absorption material silver 17, and the light absorption material enters the isolation slots in regions without the photoresist; then, through wet etching, the sample is soaked in the BOE for 1 minute, the photoresist 16 and the light absorption material 17 thereon are removed. The sample is cleaned and dried.

A preparation method for a hole-shaped deep silicon etching template in a quantum dot transfer process of deep silicon etching templates includes the following steps:

(1) A deep silicon etching template is prepared. The surface of a cleaned 500 μm thick silicon wafer 18 is spin-coated with an AZ4620 positive photoresist 19, and prebaking is carried out under 95° C. for 4 minutes. Then, an ultraviolet lithography technology is adopted to transfer graphs of periodical square holes in the surface of a photoetching plate and "+"-shaped alignment marks on diagonal corners of each array to the surface of the silicon wafer. Development is carried out. Post-baking under 110° C. is carried out for 5 minutes. The edge length of the square holes is 180 μm. The rectangular "+"-shaped alignment marks are 40 μm long and 20 μm wide.

(2) The photoresist is taken as a mask. A deep silicon etching technology is adopted. Gases C$_4$F$_8$ and SF$_6$ are introduced into a reaction chamber for etching for 95 minutes and 20 seconds. The silicon wafer is etched through. Hollow square hole-shaped structures and "+"-shaped alignment marks are formed on the surface of the silicon wafer.

A quantum dot transfer process of deep silicon etching templates includes the following steps:

(1) A deep silicon etching template is placed above micro-LEDs. A "+"-shaped alignment mark on a silicon wafer and a "+"-shaped photoetching alignment mark on a micro-LED array are aligned under a microscope.

(2) A blue light quantum dot, a red light quantum dot, a green light quantum dot and a yellow light quantum dot of perovskite CsPbBr$_3$ are dissolved in a methylbenzene solvent respectively. Then, the surface of the deep silicon etching template is spin-coated with a blue light quantum dot solution. The quantum dots enter the micro-LED array device via square holes in the deep silicon etching template. The micro-LEDs spin-coated with the quantum dots and the deep silicon etching template are placed on a 60° C. drying table for drying. The deep silicon etching template is removed; and on the micro-LED array device, only one of RGB pixel points is coated with the blue light quantum dot.

(3) According to the preparation method of the hole-shaped deep silicon etching template, the positions of the square micro holes in the deep silicon etching template are changed. Three new deep silicon etching templates are prepared. Step (1) and step (2) are repeated three times. The micro holes of each RGB pixel unit are filled with a red light quantum dot solution, a green light quantum dot solution and a yellow light quantum dot solution, so that four-color display of each RGB pixel point is realized. A schematic diagram of a cross section of the device obtained is shown in FIG. 33. A schematic diagram of the surface is shown in FIG. 34.

Certainly, as for the present embodiment, filling sequences of the red light/green light/yellow light quantum dots can be randomly replaced, which will not bring any influence on quality and performance of the device.

As for the present embodiment, the "+"-shaped alignment marks can also be disposed at four corners or any corner of the device and the silicon wafer.

In the present embodiments of the present invention, square holes are taken as the hollow holes of the deep silicon etching templates. In fact, it is feasible to make the hollow holes into rectangular holes or round holes or elliptic holes. It is only necessary to note that the holes are sized to completely expose the micro holes to be filled with the quantum dots and guarantee that the micro holes to be filled with the quantum dots of other colors are not exposed.

The foregoing embodiments are preferred implementations of the present invention, but the implementations of the present invention is not limited by the foregoing embodiments. Any other changes, modifications, replacements, combinations, or simplification made without departing from the spirit essence and principle of the present invention shall be regarded as equivalent substitutions and shall fall within the protection scope of the present invention.

What is claimed is:

1. A micro panchromatic QLED array device based on a quantum dot transfer process of deep silicon etching templates, wherein a substrate material of the micro panchromatic QLED array device is a standard blue LED epitaxial wafer or a standard violet LED epitaxial wafer;

wherein the standard blue LED epitaxial wafer and the standard violet LED epitaxial wafer each comprising: a quantum well active layer on an n-type GaN layer, and a p-type GaN layer on the quantum well active layer;

wherein array-type square table structures are formed by etching on the p-type GaN layer and the quantum well active layer until reaching the n-type GaN layer, wherein the array-type square table structures pass through the p-type GaN layer and the quantum well active layer and the array-type square table structures are deep to the n-type GaN layer;

the array-type square table structures are mutually isolated;

each of the square table structures constitutes a micro-LED;

and micro holes are deep to the p-type GaN layer or the quantum well active layer or the n-type GaN layer, and the micro holes are formed through etching in each of the square table structures to form a micro hole array;

the micro panchromatic QLED array device further comprises a p-type array electrode and an n-type electrode, wherein the p-type array electrode is evaporated on the p-type GaN layer of the micro hole array, and the n-type electrode is evaporated on the n-type GaN layer;

every 2*2 square table structure of the array-type square table structures constitute an RGB pixel unit, wherein among four micro holes of each of the RGB pixel unit, a first micro hole of the four micro holes is filled with a red light quantum dot, a second micro hole of the four micro holes is filled with a green light quantum dot, a third micro hole of the four micro holes is filled with a yellow light quantum dot, and a fourth micro hole of the four micro holes emits a blue light or the fourth micro hole of the four micro holes is filled with a blue light quantum dot;

in each of the RGB pixel unit, a rectangular isolation slot etched until reaching the n-type GaN layer is configured between every two adjacent ones of the square table structures, and the rectangular isolation slot is filled with a light absorption material for a light isolation, the light absorption material is separated from each of the square table structures by a dielectric layer; and each micro hole of the four micro holes is filled with the red light, green light, yellow light, or blue light quantum dot by each of the deep silicon etching templates.

2. The micro panchromatic QLED array device according to claim 1, wherein each of the deep silicon etching templates is formed by adopting a deep silicon etching technology to etch a silicon wafer through to form a hollow square hole structure and a "+"-shaped alignment mark, corresponding to a position of the micro holes filled with the red light, green light, yellow light, or blue light quantum dot, on a surface of the silicon wafer; the "+"-shaped alignment mark is also disposed at a corresponding position on a surface of a micro-LED array device to align each of the deep silicon etching templates with the micro-LED array device; and then, the micro panchromatic QLED array device is prepared through spin-coating of quantum dots, wherein the "+"-shaped alignment mark is disposed at each of four corners or diagonal corners or one corner of each array.

3. The micro panchromatic QLED array device according to claim 1, wherein a regional area with a configuration of the micro hole array is larger than or equal to 4 inches; a diameter of each of the micro holes is 20-100 μm; a cycle is 100-200 μm; an interval between the micro-LEDs is 80-100 μm; and a depth of each of the micro holes is 200 nm to 1.5 μm.

4. The micro panchromatic QLED array device according to claim 1, wherein the rectangular isolation slot is disposed between the two adjacent ones of the square table structures; the rectangular isolation slot has a width of 10-20 μm, a length of being equal to an edge length of each of the square table structures, and a depth of 950 nm; the rectangular isolation slot is filled with the light absorption material; and the light absorption material is a Vantablack or a silver.

5. A preparation method for the micro panchromatic QLED array device according to claim 1, comprising the following steps:

1) evaporating a dielectric layer on the standard blue LED epitaxial wafer or the standard violet LED epitaxial wafer by a PECVD technology;

2) spin-coating a surface of the dielectric layer with a photoresist layer and carrying out prebaking on the photoresist layer, using an ultraviolet lithography technology to transfer ordered square table array graphs on a photoetching plate, graphs of isolation slots for separating adjacent micro hole regions in the square table structures and graphs of "+"-shaped alignment marks between the two adjacent ones of the square table structures to the photoresist layer, and then carrying out development and post-baking;

3) using an RIE technology to introduce $O_2$ to remove a few of photoresist residual layers in areas where most of a first photoresist is removed through development, using a PVD process to evaporate a metal mask layer, and then carrying out stripping to remove the photoresist layer and a metal film layer on the photoresist layer and obtain an area of an ordered metal square table array graphs, isolation slot graphs and "+"-shaped alignment mark graphs;

4) using the RIE technology to carry out a longitudinal etching of the dielectric layer with a first metal as a first mask, and transferring a metal square table array structure, an isolation slot structure and a "+"-shaped alignment mark structure to the dielectric layer;

5) using an ICP technology to carry out an anisotropic etching of the p-type GaN layer and the quantum well active layer with a second metal as a second mask, and transferring the metal square table array structure, the isolation slot structure between the adjacent micro hole regions and the "+"-shaped alignment marks between the two adjacent ones of the square table structures to the n-type GaN layer;

6) using a wet etching method to remove the metal mask layer and the dielectric layer on the metal square table array structure and the "+"-shaped alignment marks between the two adjacent ones of the square table structures, forming GaN square table array structures, wherein the GaN square table array structures are mutually isolated and repairing an etching damage on a GaN and side walls of a quantum well;
7) preparing a micro hole structure, wherein the PECVD technology is firstly adopted to evaporate the dielectric layer on each of the GaN square table array structures, the surface of the dielectric layer is spin-coated with a second photoresist, and prebaking is carried out on the surface of the dielectric layer; the ultraviolet lithography technology and the photoetching plate are adopted to realize an overlaying on the second photoresist of the metal square table array structure to form micro hole graphs; the RIE technology is adopted at first to etch the dielectric layer, then the ICP technology is adopted to etch the p-type GaN layer; and finally the micro hole array is obtained, wherein a depth of each micro hole is etched to the p-type GaN layer, the quantum well active layer or the n-type GaN layer;
8) using the wet etching method to remove the dielectric layer on the metal square table array structure and the second photoresist left on the dielectric layer, and repairing the etching damage on the GaN and surfaces and the side walls of the quantum well;
9) evaporating the dielectric layer again on the standard blue LED epitaxial wafer;
10) preparing an n-type electrode, wherein the surface of the dielectric layer is spin-coated with a third photoresist and the ultraviolet lithography technology is adopted to overlay an n-type electrode graph on the photoetching plate to the third photoresist; the RIE technology is adopted, the dielectric layer is etched with the third photoresist as a third mask, and the n-type electrode graph is transferred to the n-type GaN layer; the PVD process is adopted to evaporate a first metal layer as the n-type electrode; then, the third photoresist and the metal film layer on the third photoresist layer are stripped and removed, and a sample is cleaned and dried; and a thermal annealing is carried out to realize an ohmic contact between the first metal layer and the n-type GaN;
11) preparing a p-type electrode, wherein spin-coating of a fourth photoresist layer is carried out again, and the ultraviolet lithography technology and the photoetching plate are adopted to realize overlaying on the fourth photoresist to form a p-type electrode graph; the RIE technology is adopted to etch a dielectric layer film with the fourth photoresist as a fourth mask, and the p-type electrode graph is transferred to the p-type GaN layer; then the PVD process is adopted to evaporate a second metal layer as the p-type electrode; the wet etching is adopted to remove the fourth photoresist and the metal film layer on the photoresist layer, and the sample is cleaned and dried; and the thermal annealing is carried out to realize an ohmic contact between the second metal layer and the p-type GaN;
12) filling the isolation slot with the light absorption material, carrying out spin-coating of a fifth photoresist, and using the ultraviolet lithography technology and the photoetching plate to realize overlaying on the fifth photoresist to form an isolation slot graph; carrying out spin-coating of a layer of the light absorption material on a surface of the sample, wherein the light absorption material enters the isolation slot in regions without the fifth photoresist; and then using the wet etching to remove the fifth photoresist and the light absorption material on the surface of the sample, and cleaning and drying the sample; and
13) using the quantum dot transfer process of the deep silicon etching templates to fill the four micro holes with red light, green light, or yellow light quantum dots.

6. The preparation method for the micro panchromatic QLED array device according to claim 5, wherein the deep silicon etching templates are fabricated at first in step 13) and a method for fabricating the deep silicon etching templates comprises:
1) intercepting a silicon wafer, wherein the silicon wafer is equal to or slightly larger than a square table array, spin-coating a surface of the silicon wafer with an AZ4620 positive photoresist, carrying out prebaking on the surface of the silicon wafer, using the ultraviolet lithography technology to transfer a photoetching plate surface graph to the surface of the silicon wafer, and then carrying out development and post-baking; and
2) using the photoresist as a fifth mask and using a deep silicon etching technology to etch the silicon wafer through, forming a hollow square hole structure and a "+"-shaped alignment mark at positions corresponding to the four micro holes filled with the red light, green light, or yellow light quantum dots on the surface of the silicon wafer, making a red light, green light, or yellow light deep silicon etching template, and etching the "+"-shaped alignment mark at a corresponding position on the surface of the sample as well.

7. The preparation method for the micro panchromatic QLED array device according to claim 6, wherein the hollow square hole structure in the deep silicon etching template has an edge length of 90-180 µm, and a depth of being larger than or equal to a thickness of the silicon wafer; the silicon wafer is etched through; the thickness of the silicon wafer is 200-500 µm; and the "+"-shaped alignment mark in the deep silicon etching template and the "+"-shaped alignment mark in the micro panchromatic QLED array device have a maximum length of 40 µm, and a maximum width of 20 µm.

8. The preparation method for the micro panchromatic QLED array device according to claim 7, wherein filling the four micro holes with the quantum dots in step 13) comprises the following steps:
1) placing any one of the red light, green light, or yellow light deep silicon etching templates on the micro-LEDs, and aligning the "+"-shaped alignment mark on the silicon wafer with a "+"-shaped photoetching mark on a micro-LED array under a microscope;
2) spin-coating the micro-LED array with the quantum dots with a corresponding color by a hole-shaped structure on the deep silicon etching template, drying the micro-LED array device spin-coated with the quantum dots, and taking down the deep silicon etching template; and
3) using the deep silicon etching templates of other two colors to repeat steps 1) and 2) twice to fill the four micro holes of each of the RGB pixel unit with quantum dots of the other two colors, thereby preparing and forming the QLED array device.

9. The preparation method for the micro panchromatic QLED array device according to claim 8, wherein the n-type electrode is a metal Ti or Al or Ni or Au; when the p-type electrode is the metal Ni or Au; a thickness of the dielectric layer is 150-250 nm, with a material of $SiO_2$; and a thickness of the metal mask layer is 30-100 nm, with a material of Ni.

10. The preparation method for the micro panchromatic QLED array device according to claim 5, wherein the red light, green light, or yellow light quantum dots are CdSe/ZnS quantum dots with an II-VI core shell structure or perovskite $CsPbBr_3$ quantum dots.

11. The micro panchromatic QLED array device according to claim 2, wherein the rectangular isolation slot is disposed between the two adjacent ones of the square table structures; the rectangular isolation slot has a width of 10-20 µm, a length of being equal to an edge length of each of the square table structures, and a depth of 950 nm; the rectangular isolation slot is filled with the light absorption material; and the light absorption material is a Vantablack or a silver.

12. The micro panchromatic QLED array device according to claim 3, wherein the rectangular isolation slot is disposed between the two adjacent ones of the square table structures; the rectangular isolation slot has a width of 10-20 µm, a length of being equal to an edge length of each of the square table structures, and a depth of 950 nm; the rectangular isolation slot is filled with the light absorption material; and the light absorption material is a Vantablack or a silver.

13. The preparation method for the micro panchromatic QLED array device according to claim 5, wherein each of the deep silicon etching templates is formed by adopting a deep silicon etching technology to etch a silicon wafer through to form a hollow square hole structure and a "+"-shaped alignment mark, corresponding to a position of the micro holes filled with the red light, green light, yellow light, or blue light quantum dot, on a surface of the silicon wafer; the "+"-shaped alignment mark is also disposed at a corresponding position on a surface of a micro-LED array device to align each of the deep silicon etching templates with the micro-LED array device; and then, the micro panchromatic QLED array device is prepared through spin-coating of quantum dots, wherein the "+"-shaped alignment mark is disposed at each of four corners or diagonal corners or one corner of each array.

14. The preparation method for the micro panchromatic QLED array device according to claim 5, wherein a regional area with a configuration of the micro hole array is larger than or equal to 4 inches; a diameter of each of the micro holes is 20-100 µm; a cycle is 100-200 µm; an interval between the micro-LEDs is 80-100 µm; and a depth of each of the micro holes is 200 nm to 1.5 µm.

15. The preparation method for the micro panchromatic QLED array device according to claim 5, wherein the rectangular isolation slot is disposed between the two adjacent ones of the square table structures; the rectangular isolation slot has a width of 10-20 µm, a length of being equal to an edge length of each of the square table structures, and a depth of 950 nm; the rectangular isolation slot is filled with the light absorption material; and the light absorption material is a Vantablack or a silver.

* * * * *